(12) United States Patent
Hsieh et al.

(10) Patent No.: US 11,915,994 B2
(45) Date of Patent: Feb. 27, 2024

(54) PACKAGE STRUCTURE COMPRISING A SEMICONDUCTOR DIE WITH A THERMOELECTRIC STRUCTURE AND MANUFACTURING METHOD THEREOF

(71) Applicant: Taiwan Semiconductor Manufacturing Company, Ltd., Hsinchu (TW)

(72) Inventors: Cheng-Yen Hsieh, Hsinchu (TW); Chih-Horng Chang, Taipei (TW); Chung-Yu Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 104 days.

(21) Appl. No.: 17/401,276

(22) Filed: Aug. 12, 2021

(65) Prior Publication Data

US 2023/0051881 A1  Feb. 16, 2023

(51) Int. Cl.
*H01L 23/38* (2006.01)
*H01L 25/065* (2023.01)
*H01L 23/498* (2006.01)
*H01L 23/48* (2006.01)
*H10N 10/01* (2023.01)

(52) U.S. Cl.
CPC ............ *H01L 23/38* (2013.01); *H01L 23/481* (2013.01); *H01L 23/49816* (2013.01); *H01L 23/49833* (2013.01); *H01L 23/49838* (2013.01); *H01L 25/0655* (2013.01); *H01L 25/0657* (2013.01); *H10N 10/01* (2023.02); *H01L 2225/06524* (2013.01); *H01L 2225/06541* (2013.01); *H01L 2225/06589* (2013.01)

(58) Field of Classification Search
CPC ....................................................... H01L 23/38
USPC ........................................................ 257/712
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |

(Continued)

*Primary Examiner* — Ajay Arora
(74) *Attorney, Agent, or Firm* — JCIPRNET

(57) ABSTRACT

A package structure is provided. The package structure includes a semiconductor die and a thermoelectric structure disposed on the semiconductor die. The thermoelectric structure includes P-type semiconductor blocks, N-type semiconductor blocks and metal pads. The P-type semiconductor blocks and the N-type semiconductor blocks are arranged in alternation with the metal pads connecting the P-type semiconductor blocks and the N-type semiconductor blocks. When a current flowing through one of the N-type semiconductor block, one of the metal pad, and one of the P-type semiconductor block in order, the metal pad between the N-type semiconductor block and the P-type semiconductor block forms a cold junction which absorbs heat generated by the semiconductor die.

15 Claims, 20 Drawing Sheets

(56) References Cited

U.S. PATENT DOCUMENTS

2006/0102223 A1* 5/2006 Chen ................... H10N 19/00
                                                257/E27.008
2019/0189572 A1* 6/2019 Chiang ............... H01L 23/5226

* cited by examiner

PACKAGE STRUCTURE COMPRISING A SEMICONDUCTOR DIE WITH A THERMOELECTRIC STRUCTURE AND MANUFACTURING METHOD THEREOF

BACKGROUND

The semiconductor industry has experienced rapid growth due to continuous improvements in the integration density of various electronic components (i.e., transistors, diodes, resistors, capacitors, etc.). The improvement in integration density has come from continuous reductions in minimum feature size, which allows more smaller components to be integrated into a given area. With more electronic components packed inside the device, the heat generated by the electronic components will raise the temperature of the device significantly and affect the performance of the device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
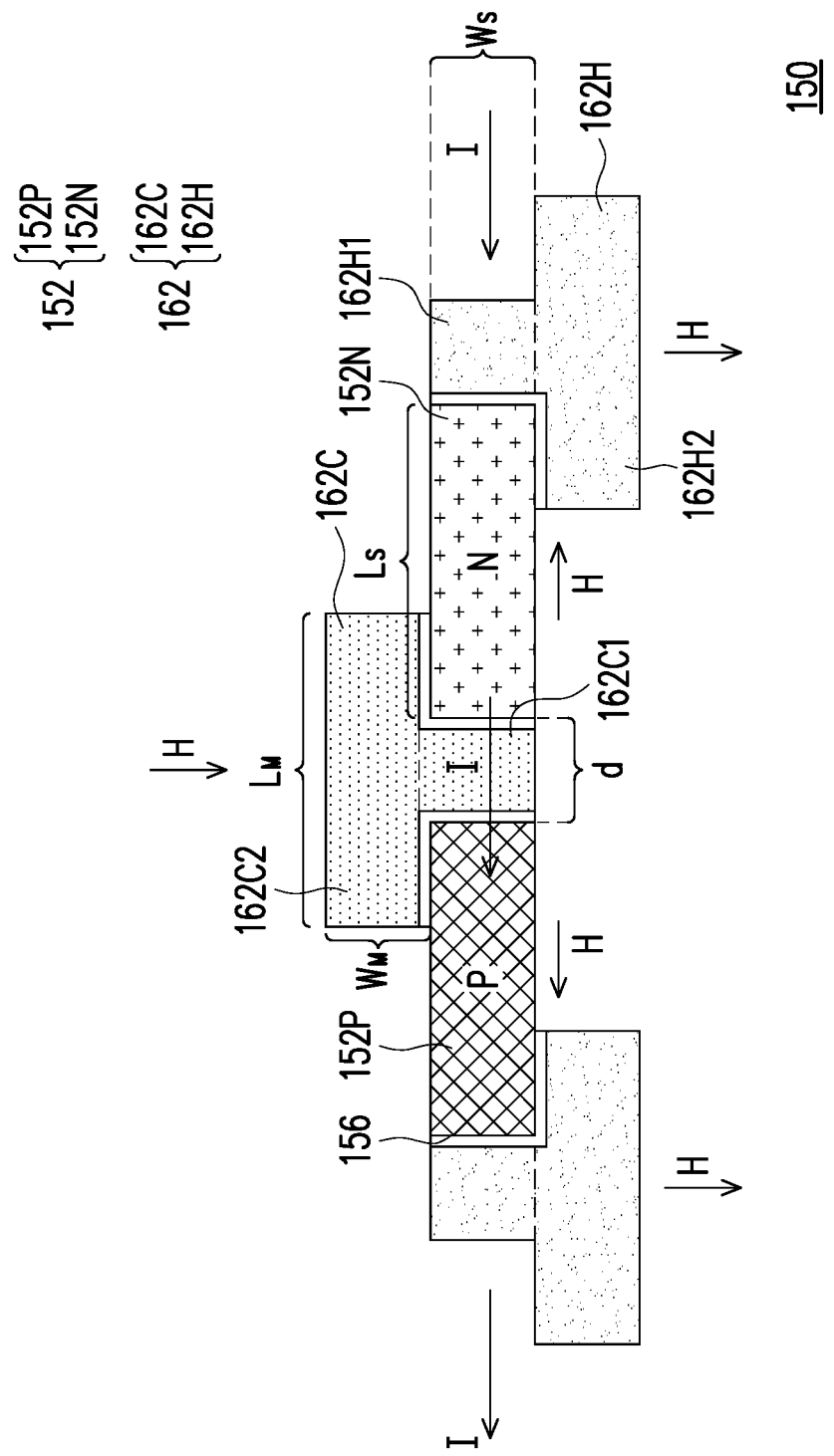
FIGS. 1A and 1B are schematic top views of thermoelectric devices according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

When the size of the semiconductor device becomes smaller, the heat generated by the semiconductor device may significantly increase the temperature of the semiconductor device and decreases the performance of the semiconductor device. Therefore, to remove the heat from the semiconductor devices become an important issue.

The metal vias such as through InFO via (TIV) or through silicon via (TSV) are often used to help dissipation of the heat generated by the semiconductor device. However, by using the metal vias to transfer the heat generated by the semiconductor device, the heat is transferred through thermal conduction of the metal vias, which is slow and only transfers heat in a single direction. Also, this kind of conductive cooling only cools one certain surface and the cooling efficiency is rather low. Furthermore, the space needed for the heat sink (e.g. the vertical height of the metal vias) is rather huge (typically around 800-1000 microns), and the heat transfer efficiency is significantly limited.

FIG. 1A is a top view of a thermoelectric device 150. The thermoelectric device 150 includes semiconductor blocks 152. The semiconductor blocks 152 includes a P-type semiconductor block 152P and a N-type semiconductor block 152N connected electrically in series. The current I flows through the thermoelectric device 150 from the N-type semiconductor block 152N to the P-type semiconductor block 152P and forms a junction between the P-type semiconductor block 152P and the N-type semiconductor block 152N. The flowing direction of the current flowing through the thermoelectric device 150 may be referred as a first direction, and the direction transverse the direction of the current may be referred as a second direction.

In some embodiments, the material of the P-type semiconductor block 152P may be $Sb_2Te_3$, P-type polysilicon, or the like. In some embodiments, the material of the N-type semiconductor block 152N may be $Bi_2Te_3$, N-type polysilicon, or the like. The P-type semiconductor block 152P and N-type semiconductor block 152N are both rectangular-shaped from a top view. The sizes of the P-type semiconductor block 152P and N-type semiconductor block 152N are substantially the same. The size of the semiconductor blocks 152P and 152N includes the length Ls along the first direction, the width Ws along the second direction, the thickness, the area, the shape, and is not limited thereto. The long sides of the rectangular-shaped semiconductor blocks 152P and 152N are substantially parallel with the first direction, and the short sides of the rectangular-shaped semiconductor blocks 152P and 152N are substantially parallel with the second direction, or are substantially perpendicular to the first direction. The length Ls, or the length of the long side, of the semiconductor blocks 152P and 152N is between 200-800 μm. The width Ws, or the length of the short side, of the semiconductor blocks 152P and 152N is between 100-200 μm. The gap d between the P-type semiconductor block 152P and a N-type semiconductor block 152N is between 5-50 μm, and is preferably 20 μm. In some embodiments, the thickness of the P-type semiconductor block 152P and N-type semiconductor block 152N is between 1-3 μm, preferably 2 μm. In some embodiments, the sizes of the P-type semiconductor block 152P and the N-type semiconductor block 152N depends on the technology node which may be increased or decreased.

Metal pads 162 are formed at both ends of the P-type semiconductor block 152P and the N-type semiconductor block 152N. One of the metal pad 162 is formed between the P-type semiconductor block 152P and the N-type semiconductor block 152N, another metal pad 162 is formed at the other side of the P-type semiconductor block 152P, and the other metal pad 162 is formed at the other side of the N-type semiconductor block 152N. In some embodiments, the metal pads 162 are disposed on a same level of the P-type semiconductor block 152P and the N-type semiconductor block 152N. In some embodiments, the material of the metal pads 162 may be copper or the like. As shown in FIG. 1A, when the current I flows from the N-type semiconductor block 152N to the P-type semiconductor block 152P, the metal pad 162 formed between the N-type semiconductor block 152N and the P-type semiconductor block 152P is referred as metal pad 162C. The metal pad 162 which the current flows through before flowing to the N-type semiconductor block 152P and the metal pad 162 which the current flows to after flowing through the P-type semiconductor block 152P are referred as metal pads 162H.

In some embodiments, the P-type semiconductor block 152P and the N-type semiconductor 152N are connected through the metal pads 162. The metal pads include metal pads 162C and 162H. The metal pads 162C and 162H connect with the P-type semiconductor block 152P with at least one side, and connect with the N-type semiconductor block 152N with at least one side. In some embodiments, as shown in FIG. 1A, the metal pads 162C and 162H connect with the P-type semiconductor block 152P with two adjacent side walls from the top view. The metal pads 162C and 162H also connect with the N-type semiconductor block 152N with two adjacent side walls from the top view.

In some embodiments, the metal pads 162 (162C and 162H) are T-shaped metal pads and comprising two portions. The first portions (162C1 and 162H1) of the metal pads 162 may be referred as the stem portion. The second portions (162C2 and 162H2) of the metal pads 162 may be referred as the arm portion. In some embodiments, the first portion, or the stem portion, of the metal pad 162 (e.g., the portions 162C1 and 162H1) is at the gap between the short sides of P-type semiconductor block 152P and the N-type semiconductor block 152N from the top view. The stem portion (162C1 and 162H1) of the metal pad 162 contacts with the P-type semiconductor block 152P and the N-type semiconductor block 152N. In some embodiments, the stem portion of the T-shaped metal pad (162C1 and 162H1) connects with a side wall at a short side of rectangular-shaped the P-type semiconductor block 152P and a side wall at a short side of the rectangular-shaped N-type semiconductor block 152N. When the current I flows from the N-type semiconductor block 152N to the P-type semiconductor block 152P, the current flows through the first portion 162C1.

In some embodiments, the second portion, or the arm portion of the metal pad 162 (e.g., the portions 162C2 and 162H2) is rectangular-shaped from the top view. In some embodiments, a long side of the second portion, or the arm portion, of the metal pad 162 (162C2 and 162H2) contacts with a portion of a side wall at the long side of the rectangular-shaped P-type semiconductor block 152P, a portion of a side wall at the long side of the rectangular-shaped N-type semiconductor block 152N, and the first portion of the T-shaped metal pad (162C1 or 162H1). In some embodiments, arm portions of the adjacent T-shaped metal pads, such as 162C2 and 162H2, are at opposite long sides of the rectangular-shaped P-type semiconductor block 152P and the N-type semiconductor block 152N.

In some embodiments, the width of the first portion of the metal pad 162 (e.g., portions 162C1 and 162H1) along the first direction is substantially the same as the width of the gap between the P-type semiconductor block 152P and the N-type semiconductor block 152N, which is between 5-50 μm, preferably 20 μm. In some embodiments, the width of the first portion of the metal pad 162 along the second direction is substantially the same as the width of the P-type semiconductor block 152P or the width Ws of the N-type semiconductor block 152N, which is between 100-200 μm.

In some embodiments, the width LM of the second portion of the metal pad 162 (e.g., portions 162C2 and 162H2) along the first direction is substantially the same as the width $L_S$ of the P-type or the N-type semiconductor blocks 152P or 152N along the first direction, which is between 200-800 μm. In some embodiments, the width $W_M$ of the second portion of the metal pad 162 along the second direction is substantially the same as the width $W_S$ of the P-type or the N-type semiconductor block 152P or 152N along the second direction, which is between 100-200 μm. In some embodiments, the size of the second portion of the metal pad 162 is substantially the same as the semiconductor blocks 152. In some embodiments, the first portion of the metal pad 162 is substantially at the center of the width of the second portion of the metal pad 162 along the first direction.

In some embodiments, the barrier layers 156 are formed at the interface between the semiconductor blocks 152 and the metal pads 162. In some embodiments, the barrier layers 156 are formed at the interface between the P-type semiconductor block 152P and the metal pads 162C and 162H, and at the interface between the N-type semiconductor block 152N and the metal pads 162C and 162H, to separate the semiconductor blocks 152P and 152N from the metal pads 162C and 162H. The barrier layers 156 are also served as the seed layers so the metal pads 162 may be disposed on the surface of the semiconductor blocks 152P and 152N. In some embodiments, the barrier layers 156 may be Ti, Ti—Cu, Ti—Ni, Ti—Cu—Ni, or the like. In some embodiments, the barrier layers 156 includes $Ti_{0.5}Cu_2$.

When the current flows through a semiconductor junction formed by a N-type semiconductor (such as the N-type semiconductor block 152N in FIG. 1A) and a P-type semiconductor (such as the P-type semiconductor block 152P in FIG. 1A) connecting through a metal pad, which forms a junction between the N-type semiconductor and the P-type semiconductor. The junction (such as the metal pad 162C in FIG. 1A) absorbs the heat from the environment due to the Peltier effect. The Peltier effect is that when the current follows through a junction formed by different types of semiconductors, the heat is removed by electron or hole diffusion current from one side of the semiconductor to another side of the semiconductor and forms a temperature gradient within the semiconductor. To be specific, in some embodiments, when the current flows from a N-type semiconductor to a P-type semiconductor, temperature gradients are formed in the N-type semiconductor and the P-type semiconductor, wherein the cold sides of the N-type semiconductor and the P-type semiconductor are connecting with each other and forms a cold junction, and the heat in the environment is absorbed by the cold junction between the N-type semiconductor and the P-type semiconductor. In some embodiments, when the current flows from a P-type semiconductor to a N-type semiconductor, temperature gradients are formed in the P-type semiconductor and the N-type semiconductor, wherein the hot sides of the N-type semiconductor and the P-type semiconductor are connecting with each other and forms a hot junction, and the heat in the P-type semiconductor and the N-type semiconductor or the heat absorbed by the cold junction is released to the environment through the hot junction between the P-type semiconductor and the N-type semiconductor. In other words, whether a junction is a cold junction or a hot junction depends on the direction of the current flowing through the junction.

Referring back to FIG. 1A, in some embodiments, when the voltage is applied between the N-type semiconductor block 152N and P-type semiconductor block 152P, wherein the voltage at the N-type semiconductor block 152N is higher than the P-type semiconductor block 152P, the current I flows through the metal pad 162H on the right of the N-type semiconductor block 152N, the N-type semiconductor block 152N, the metal pad 162C, the P-type semiconductor block 152P and to the metal pad 162H at the left of the semiconductor block 152P in order. Due to the Peltier effect, since the current flows from the N-type semiconductor block 152N to the P-type semiconductor block 152P, the metal pad 162C is a cold junction. As a result, the temperature of the metal pad 162C decreases, and absorbs the heat from the environment. Since the temperature of the metal pad 162C is decreased and is lower than the temperature of the environment, the heat, such as the heat generated by a semiconductor die, flows from the environment to the metal pad 162C. Specifically, the heat from the environment flows or transfers to the first portion 162C1 of the metal pad 162C through the second portion 162C2 of the metal pad 162C. The environmental heat absorbed by the metal pad 162C is then transferred to the two metal pads 162H through the P-type semiconductor block 152P and the N-type semiconductor block 152N. The heat transferred to the two metal pads 162H is transferred to the first portions 162H1 of the metal pads 162H and later is released to the environment through the second portions 162H2 of the metal pads 162H.

Through this heat absorption-release process, the temperature at the metal pad 162C decreases, and the temperature at the metal pads 162H increases. As a result, the metal pad 162C may be referred as a cold junction, since the metal pad 162C absorbs the heat from the environment, and the metal pads 162H may be referred as hot junctions 162H, since the metal pads 162H release the heat absorbed by the metal pad 162C to the environment.

Referring again to FIG. 1A, in some embodiments, the metal pad 162C is referred as a cold junction when the current flows from the N-type semiconductor block 152N to the P-type semiconductor block 152P. The second portion 162C2, or the arm portion, of the metal pad 162C faces toward the heat source, the high temperature region, or an interior of a package structure, and absorbs the heat from the environment. In some embodiments, the metal pad 162H is referred as a hot junction when the current flows from the N-type semiconductor block 152N to the P-type semiconductor block 152P. The second portion 162H2, or the arm portion, of the metal pad 162H faces away from the heat source or the high temperature region, or faces toward an exterior of a package structure, and releases the heat to the environment. In some embodiments, the second portion 162C2 of the metal pad 162C and the second portion 162H2 of the metal pad 162H are located on opposite sides of the thermoelectric device 150.

As a result, by applying the current I, the thermoelectric device 150 may actively removes the heat generated by the heat source and cools the heat source near the metal pad 162C, or cold junction 162C, by absorbing the heat released by the heat source through the metal pad 162C, or the cold junction 162C. The heat absorbed by the metal pad 162C is released to the environment through the metal pads 162H, or the hot junctions 162H. By increasing the number of the thermoelectric device 150, such as connecting the thermoelectric devices in series, the overall cooling ability may be increased.

In some embodiments, the thickness of thermoelectric device 150 is about 2 μm. Since the thickness of the traditional metal heat sink may be as thick as 800-1000 μm, the thickness of the thermoelectric device is much less than the thickness of the metal heat sink. As a result, more vertical space is available through using the thermoelectric device 150 to cool the semiconductor device compared with the metal heat sink.

Figure 1B:
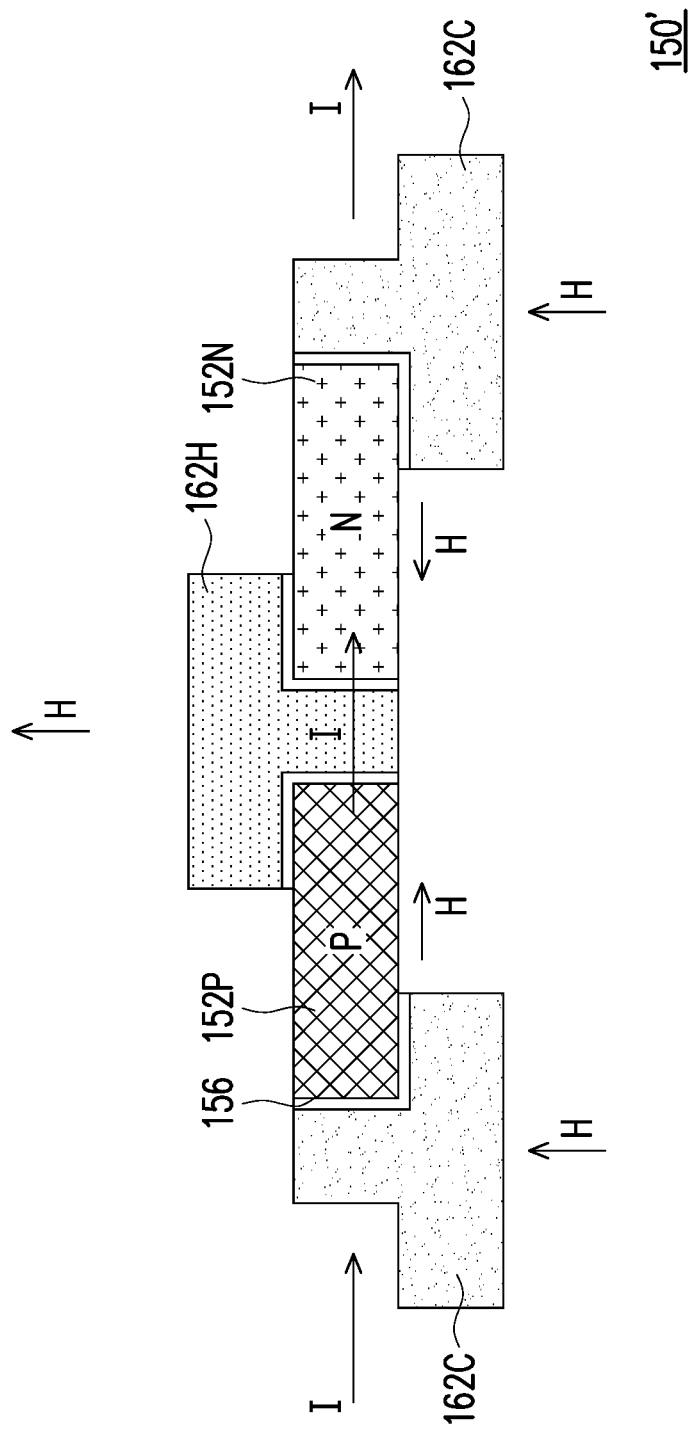

Referring to FIG. 1B, in some embodiments, the thermoelectric device 150' is provided. The structure of the thermoelectric device 150' is the same as the thermoelectric 150 in FIG. 1A, which is formed by a P-type semiconductor block 152P, a N-type semiconductor block 152N, and three metal pads 162, including metal pads 162C and 162H. The difference between the thermoelectric devices 150 and 150' is that the current flow through the thermoelectric devices 150' in a direction different from the current direction flowing through the thermoelectric device 150. the current I may flow through the thermoelectric device 150' from the metal pad 162C on the left of the P-type semiconductor block 152P, P-type semiconductor block 152P, the metal pad 162H, the N-type semiconductor block 152N to the metal pad 162C on the right of the N-type semiconductor block 152N.

In this situation, the thermoelectric device 150' becomes a heat pump. Due to the Peltier effect, the metal pad 162H, which is between the P-type semiconductor block 152P and the N-type semiconductor block 152N, becomes a hot junction, and the metal pads 162C on the left of the P-type semiconductor block 152P and on the right of the N-type semiconductor block 152N become cold junctions. The heat from the environment is absorbed by the two metal pads 162C which are on the left of the P-type semiconductor block 152P and on the right of the N-type semiconductor block 152N respectively. The heat absorbed by the metal pads 162C is then transferred to the metal pad 162H, which is a hot junction, between the P-type semiconductor block 152P and the N-type semiconductor block 152N. The heat transferred to the metal pad 162H is then released to the environment.

Referring to FIGS. 1A and 1B, when the current flows from a N-type semiconductor block to a P-type semiconductor block, a cold junction is formed between the N-type semiconductor block and the P-type semiconductor block. When the current flows from a P-type semiconductor block to a N-type semiconductor block, a hot junction is formed between the P-type semiconductor block and the N type semiconductor block. When the current flows in to a thermoelectric device including the P-type semiconductor blocks and N-type semiconductor blocks connect in series and are arranged in alternation, the hot junctions and cold junctions are also formed in alternation. When the thermoelectric device is used as a cooler (such as shown in FIG. 1A), the cold junctions (such as the second portion 162C2 of the metal pad 162C) should be arranged facing toward the heat source to absorb the heat generated from the heat source, and the hot junctions (such as the second portion 162H2 of the metal pad 162H) should be arranged facing away from the heat source to release the heat absorbed by the cold junction. In other words, the location of the second portion of the metal pad determines the direction of absorbing or releasing the heat.

Figure 2:
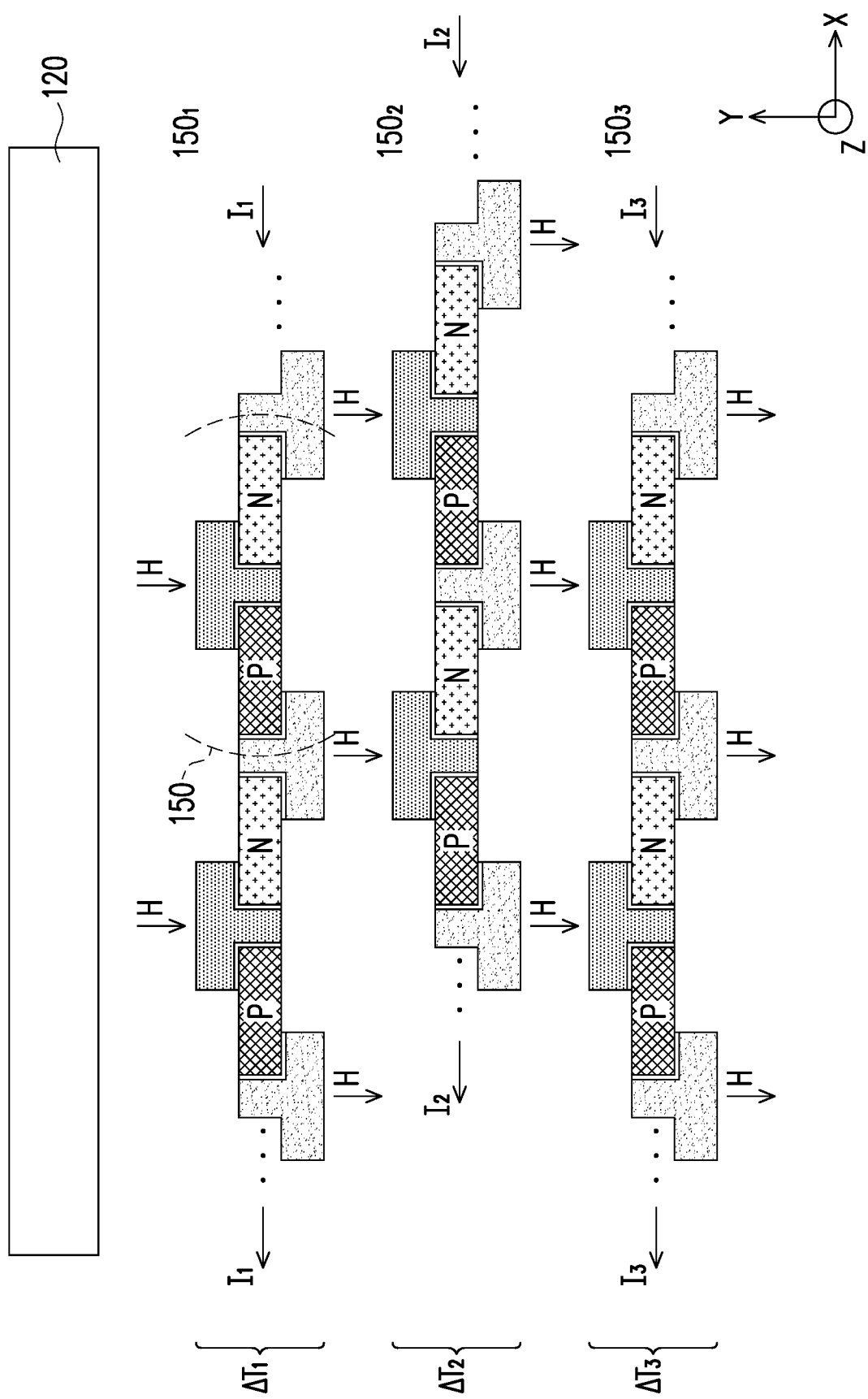
FIG. 2 is a schematic top view of thermoelectric structures according to some exemplary embodiments of the present disclosure.

Referring to FIG. 2, in some embodiments, a heat source 120 is provided. In some embodiments, the heat source may be a semiconductor die or the like. When the heat source 120 is functioning or operating, the heat source 120 generates a significant amount of heat which may increase the temperature of the heat source 120, and may decrease the performance of the heat source 120, such as a semiconductor die.

In some embodiments, as shown in FIG. 2, three thermoelectric structures $150_1$, $150_2$, and $150_3$ are provided. Each one of the thermoelectric structures, $150_1$, $150_2$, and $150_3$ includes a plurality of thermoelectric devices 150 connected in series. In some embodiments, the thermoelectric structures $150_1$, $150_2$, and $150_3$ arranged substantially parallel to each other. In some embodiments, three thermoelectric structures $150_1$, $150_2$, and $150_3$ are at the same level of the heat source 120 and are aside from the heat source 120. In some embodiments, the thermoelectric structures $150_1$, $150_2$, and $150_3$ are at a level different from the heat source 120. In some embodiments, some thermoelectric structures may be disposed above or below the heat source 120. In some embodiments, the thermoelectric structures are disposed at the back-side of the heat source 120. In some embodiments, the thermoelectric structures $150_1$, $150_2$, and $150_3$ are at different levels, respectively.

In some embodiments, the currents $I_1$, $I_2$ and $I_3$ flow through the thermoelectric structures $150_1$, $150_2$, and $150_3$ respectively, from right to left. In some embodiments, the currents $I_1$, $I_2$ and $I_3$ may be different. In some embodiments, the currents $I_1$, $I_2$ and $I_3$ may be the same. When the currents $I_1$, $I_2$ and $I_3$ flow through the thermoelectric structures $150_1$, $150_2$, and $150_3$ respectively, the heat H generated by the heat source 120 is absorbed by the first thermoelectric structure $150_1$ and is then released and transferred to the second thermoelectric structure $150_2$ along a negative Y direction, as shown in FIG. 2. This heat H transferred through the first thermoelectric structure $150_1$ may generate a temperature drop of $\Delta T_1$.

The second thermoelectric structure $150_2$ releases and transfers the heat H absorbed from the first thermoelectric structure $150_1$ to the second thermoelectric structure $150_3$ along a negative Y direction, as shown in FIG. 2. The heat H transferred through the second thermoelectric devices $150_2$ may generate a temperature drop of $\Delta T_2$.

The third thermoelectric structure $150_3$ further releases and transfers the heat H absorbed from the thermoelectric structure $150_2$ to the environment along a negative Y direction, as shown in FIG. 2. The heat transferred through the third thermoelectric structure $150_3$ may generate a temperature drop of $\Delta T_3$.

In some embodiments, if the heat source 120 and the thermoelectric structures $150_1$, $150_2$, and $150_3$ are at different levels, the heat generated by the heat source 120 may first being transferred to the level of the thermoelectric structures $150_1$, $150_2$, and $150_3$ via vertical heat conduction. Then the heat generated by the heat source 120 may be transferred away through the thermoelectric structures $150_1$, $150_2$, and $150_3$.

As a result, the heat H generated by the heat source 120 may be transferred through the thermoelectric structures $150_1$, $150_2$, and $150_3$, and generate temperature drops of $\Delta T_1$, $\Delta T_2$, and $\Delta T_3$ along a −Y direction, as shown in FIG. 2. In total, with the thermoelectric structures $150_1$, $150_2$, and $150_3$, a total temperature drop $\Delta T_{total} = \Delta T_1 + \Delta T_2 + \Delta T_3$ is achieved. In other words, the temperature of the heat source 120 may drop by $\Delta T_{total}$, which significantly decreases the temperature of the heat source 120 and improves the efficiency of the heat source 120.

In some embodiments, each group of thermoelectric structures $150_1$, $150_2$, and $150_3$ may each generate a same temperature drop of $\Delta T$. In total, with the thermoelectric structures $150_1$, $150_2$, and $150_3$, a total temperature drop $3\Delta T$ is achieved. In some embodiments, the temperature drop $\Delta T$ through one of the thermoelectric structures is 10 degrees Celsius, and the total temperature drop through three thermoelectric structures $150_1$, $150_2$, and $150_3$ may be 30 degrees Celsius. In other words, this horizontally stacked thermoelectric devices provides a much better heat removal ability, which is about $n\Delta T$, where n is the number of horizontal stacks (n=3 in FIG. 2), than just using one thermoelectric structure. Furthermore, since the three thermoelectric structures $150_1$, $150_2$, and $150_3$ are disposed at the same level, the heat generated by the heat source 120 may be released horizontally to the edge of the device, or transferred along the −Y direction, as shown in FIG. 2.

Figure 3A:
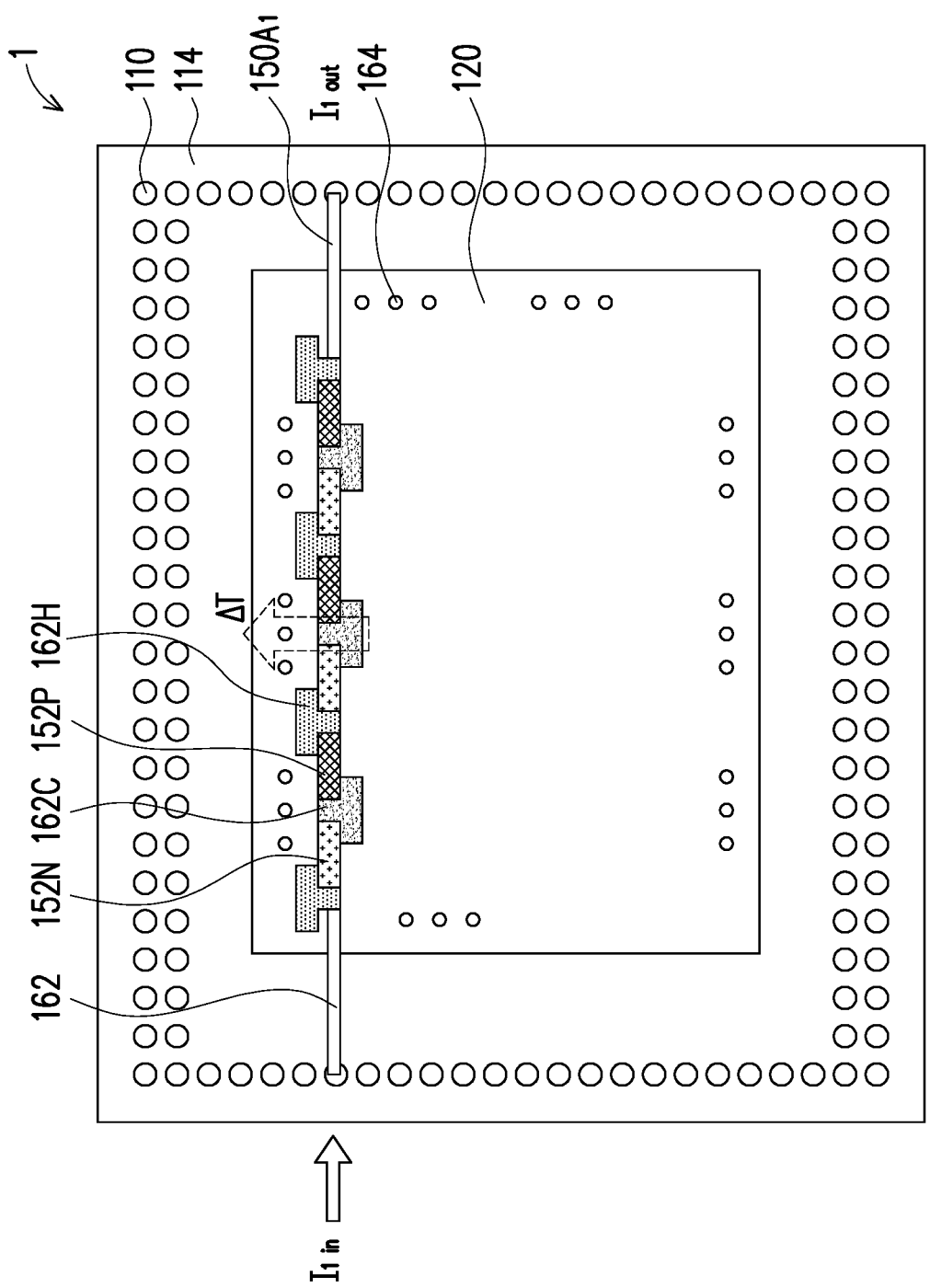
FIGS. 3A to 3C are schematic top view of the arrangements of the thermoelectric structures according to some exemplary embodiments of the present disclosure.

Referring to FIG. 3A, FIG. 3A is a top view of the package structure 1 from the back-side of the semiconductor die 120. The semiconductor die 120 is surrounded by conductive vias 110. The thermoelectric structure 150A1 is disposed at a level different from the level and above the level of the semiconductor die 120 and the conductive vias 110. The thermoelectric structure 150A1 is configured to transfer the heat generated by the semiconductor die 120 to side walls of the package structure 1. The thermoelectric structure 150A1 include a plurality of thermoelectric devices 150 connected in series, wherein each one of the thermoelectric devices 150 includes a P-type semiconductor block 152P and a N-type semiconductor block 152N, and a metal pad 162 connecting the P-type semiconductor block 152P and the N-type semiconductor block 152N. The thermoelectric structure 150A1 is connected to the conductive vias 110 through the metal pads 162.

Referring to FIG. 3A, in some embodiments, the thermoelectric structure 150A1 is disposed over the semiconductor die 120. In some embodiments, the thermoelectric structure 150A1 is disposed on the back-side of the semiconductor die 120. By placing the thermoelectric devices over the semiconductor die 120, the thermoelectric device may receive the heat generated by the semiconductor die 120 as much as possible through the vertical heat transfer. The current $I_1$ flows through the thermoelectric structure 150A1 through the conductive vias 110. When the current Ii flows through the thermoelectric structure 150A1, a temperature drop of $\Delta T$ may be generated. As a result, the temperature of the semiconductor die 120 may drop by $\Delta T$. In some embodiments, the location of the thermoelectric structure 150A1 is not limited. The number of thermoelectric devices 150 within the thermoelectric structure 150A1 is also not limited.

Figure 3B:
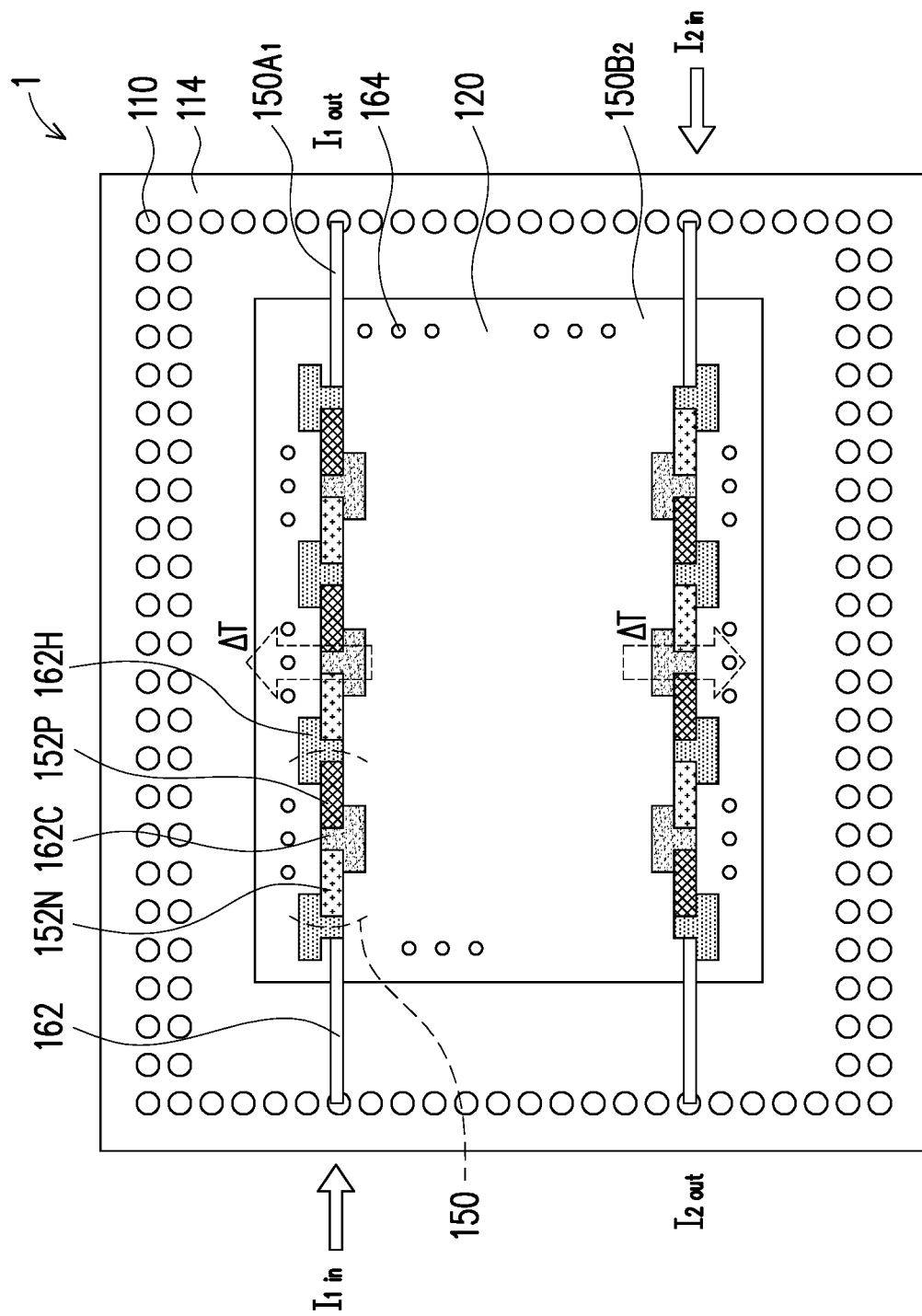

Referring to FIG. 3B, in some embodiments, there may be two thermoelectric structures 150B1 and 150B2 above the semiconductor die 120. As shown in FIG. 3B, the thermoelectric structure 150B1 is at one side of the semiconductor die 120, and the thermoelectric structure 150B2 is at the opposite side of the semiconductor die 120. With two thermoelectric structures 150B1 and 150B2 functioning at the same time, the cooling efficiency may be improved. In some embodiments, the locations and the relative positions of the thermoelectric structures 150B1 and 150B2 are not limited. The number of thermoelectric devices 150 within the thermoelectric structures 150B1 and 150B2 are also not limited. The number of thermoelectric structures is also not limited. The thermoelectric structures 150B1 and 150B2 may be arranged near the heat source or any locations according to the desired performance.

Figure 3C:
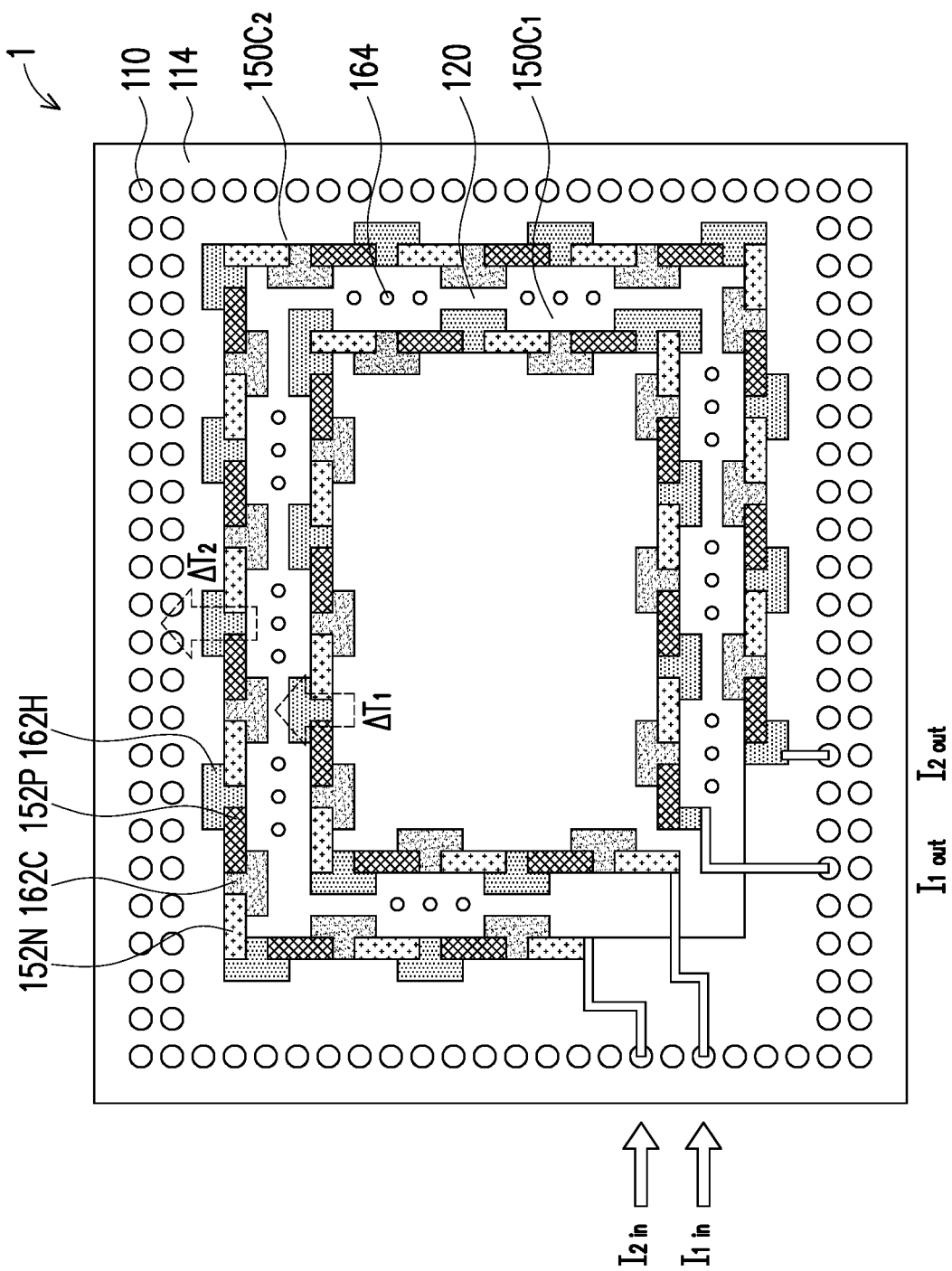

Referring to FIG. 3C, in some embodiments, the thermoelectric structures 150C1 and 150C2 are disposed around the semiconductor die 120 in ring-like shapes. In some embodiments, the thermoelectric structure 150C1 is disposed around the semiconductor die 120 and is substantially within the semiconductor die 120. The thermoelectric structure 150C2 is disposed around and is substantially outside of the semiconductor die 120. The current $I_1$ enters the thermoelectric structure 150C1 and generates a temperature drop of $\Delta T_1$. The current I2 enters the thermoelectric structure 150C2 and generates a temperature drop of $\Delta T_2$. In some embodiments, the temperature drops $\Delta T_1$ and $\Delta T_2$ may be between 10-40 degree Celsius respectively. In total, with the thermoelectric structures 150C1, 150C2, a total temperature drop $\Delta T_{total} = \Delta T_1 + \Delta T_2$ is achieved. In some embodiments, the temperature drops $\Delta T_1$ and $\Delta T_2$ may be between 10-40 degree Celsius respectively. In some embodiments, the number of the ring-like thermoelectric structures may be 15, and the total temperature for each ring-like thermoelectric structures is 10 degree Celsius, so the total temperature drop $\Delta T_{total}$ is 15*10=150 degree Celsius. The number of the thermoelectric structures and the positions of the thermoelectric devices is determined according to the desired performance.

FIGS. 4 to 14 are schematic cross-sectional views of various stages in a manufacturing method of a package structure including thermoelectrical structures according to some exemplary embodiments of the present disclosure. In exemplary embodiments, the manufacturing method is part of a wafer level packaging process. It is to be noted that the process steps described herein cover a portion of the manufacturing processes used to fabricate a package structure. The embodiments are intended to provide further explanations but are not used to limit the scope of the present disclosure.

Figure 4:
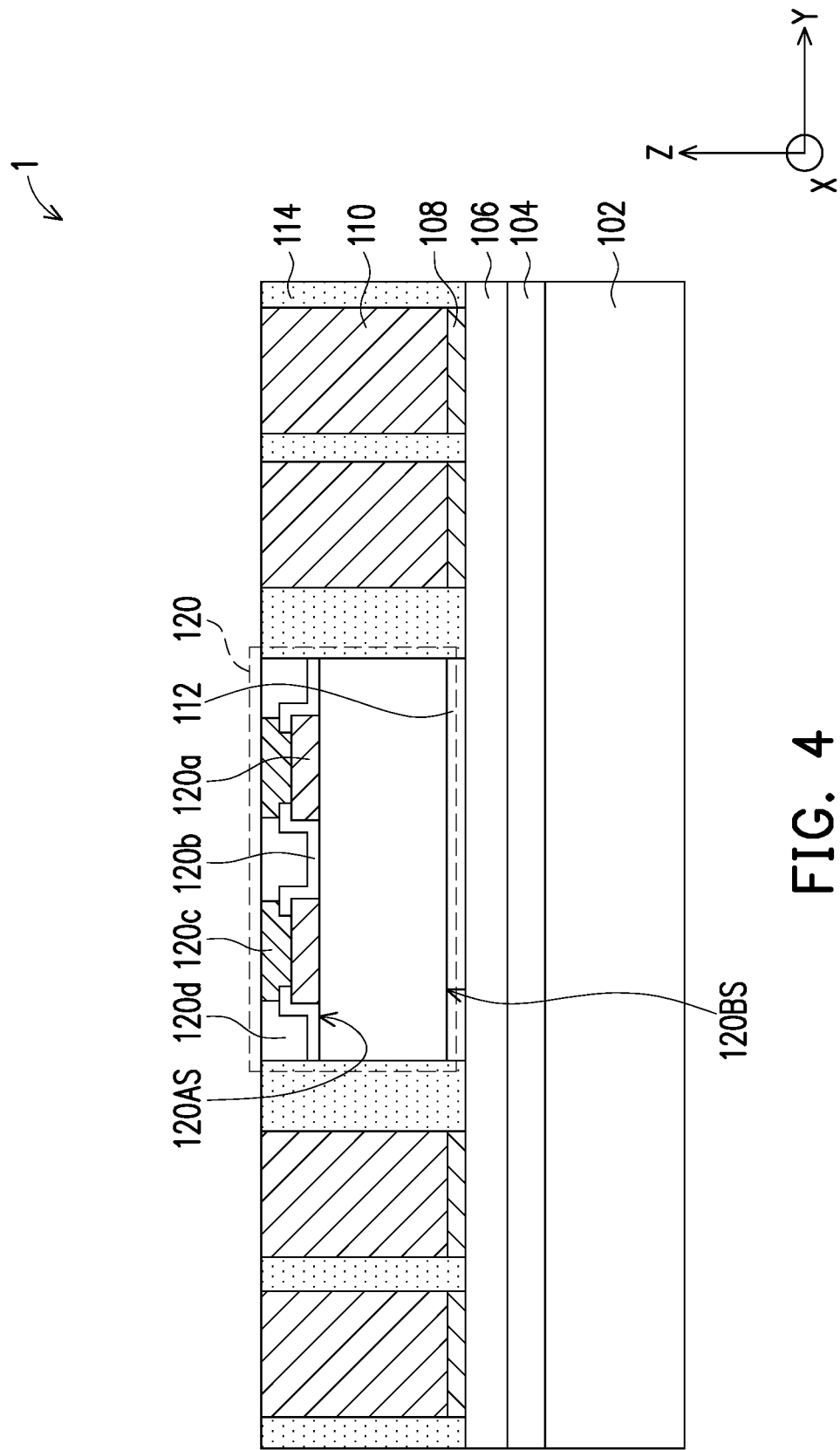
FIGS. 4 to 14 are schematic cross-sectional views of various stages in a manufacturing method of a package structure according to some exemplary embodiments of the present disclosure.

Referring to FIG. 4, in some embodiments, a carrier 102 is provided. In some embodiments, the carrier 102 is a glass carrier or any suitable carrier for the semiconductor manufacturing. Referring to FIG. 4, the carrier 102 is provided with a buffer layer 104 coated thereon. In some embodiments, the buffer layer 104 may include a die attach film made of a polymer-based dielectric material, such as epoxy adhesives. In some embodiments, the buffer layer 104 also includes a debonding layer made of any material suitable for bonding and debonding the carrier 102 from the above layer(s) or any wafer(s) disposed thereon. In some embodiments, the buffer layer 104 includes an epoxy-based thermal-release material, which loses its adhesive property when being heated, such as a light-to-heat-conversion (LTHC) release coating film. In alternative embodiments, the buffer layer 104 includes an ultra-violet (UV) glue, which loses its adhesive property when exposed to UV lights. In some embodiments, the buffer layer 104 may be dispensed as a liquid and cured, or may be a laminate film laminated onto the carrier 102, or the like. A top surface of the buffer layer 104, which is opposite to a bottom surface contacting the carrier 102, may have a high degree of coplanarity. In some embodiments, the buffer layer 104 is, a LTHC layer with good chemical resistance, and such layer enables room temperature debonding from the carrier 102 by applying laser irradiation.

A dielectric layer 106 is disposed over the buffer layer 104. In some embodiments, the material of the dielectric layers 106 includes polyimide, epoxy resin, acrylic resin, phenol resin, benzocyclobutene (BCB), polybenzoxazole (PBO), or any other suitable poly-based dielectric material. The dielectric layers may be formed by deposition.

In some embodiments, a seed layer 108 is formed on the dielectric layer 106 and conductive vias 110 are formed on the seed layer 108. In some embodiments, the conductive vias 110 may referred as the through integrated fan-out (InFO) vias (TIV). For simplification, only four conductive vias 110 are presented in FIG. 4 for illustrative purposes, however, the number of the conductive vias 110 may be determined according to the desired performance.

In some embodiments, the formation of the seed layer 108 includes blanketly forming one or more layers of metal or metal alloy materials over the dielectric layer 106 and covering the dielectric layer 106. In some embodiments, the seed layer 108 is a single layer or a composite layer comprising a plurality of sub-layers formed of different materials. In some embodiments, the seed layer 108 may include titanium, copper, molybdenum, tungsten, titanium nitride, titanium tungsten, combinations thereof, or the like. For example, the seed layer 108 may include a titanium layer and a copper layer over the titanium layer. The seed layer 108 may be formed by using, for example, chemical vapor deposition (CVD), sputtering, or physical vapor deposition (PVD).

In some embodiments, the formation of the conductive vias 110 includes forming a patterned photoresist layer (not shown) with openings on the seed layer 108, where portions of the seed layer 108 are exposed by the openings of the patterned photoresist layer. Later, the conductive vias 110 are formed within the openings of the patterned photoresist layer, respectively. In some embodiments, the conductive vias 110 are formed by forming a metallic material filling the openings to form the conductive vias 110 by plating or deposition. In some embodiments, the material of the conductive vias 110 may include a metal material such as copper or copper alloys, or the like.

After the conductive vias 110 are formed, the patterned photoresist layer is removed by performing an ashing or stripping process using an oxygen plasma, for example. In some embodiments, during the removal of the patterned photoresist layer, the uncovered seed layer 108 is also removed. In some embodiments, following the removal of the patterned photoresist layer, the seed layer 108 that is not covered by the conductive vias 110 is removed. In some embodiments, the seed layer 108 is etched off by using the conductive vias 110 as an etching mask. In some embodiments, the etching process may include a dry etching process or a wet etching process. In some embodiments, the remained portions of the seed layers 108 are located below the conductive vias 110 and are mechanically and electrically connected to the respective conductive vias 110.

In some embodiments, a semiconductor die 120 is provided onto the dielectric layer 106. In some embodiments, the semiconductor die 120 is disposed on the dielectric layer 106 through a die attach film 112. In some embodiments, the die attach film 112 may be applied to a back-side surface 120BS of the semiconductor die 120. Then, the back-side surface 120BS of the semiconductor die 120 is attached to the dielectric layer 106 by placing the die attach film 112 between the semiconductor die 120 and the dielectric layer 106. With the die attach film 112, a better adhesion between the semiconductor die 120 and the dielectric layer 106 is ensured. For example, in FIG. 4, the dielectric layer 106 is located at the back-side surface 120BS of the semiconductor die 120, so that the dielectric layer 106 may be referred as a back-side dielectric layer relative to the semiconductor die 120. In some embodiments, the conductive vias 110 surround the positioning location(s) of the semiconductor die 120.

In some embodiments, the semiconductor die 120 includes an active surface 120AS and the back-side surface 120BS opposite to the active surface 120AS. Also, the semiconductor die 120 includes pads 120*a* distributed on the active surface 120AS, a passivation layer 120*b* covering the active surface 120AS and exposing portions of the pads 120*a*, conductive pillars 120*c* connected to the exposed portions of the pads 120*a*, a protection layer 120*d* covering the passivation layer 120*b* but exposing the conductive pillars 120*c*.

In some embodiments, the pads 120*a* are partially exposed by the passivation layer 120*b*, and the conductive pillars 120*c* are disposed on and electrically connected to the pads 120*a*. The protection layer 120*d* covers the passivation layer 120*b* and the conductive pillars 120*c*.

In some embodiments, the pads 120*a* may be aluminum pads or other suitable metal pads. In some embodiments, the conductive pillars 120*c* are copper pillars, copper alloy pillars or other suitable metal pillars. In some embodiments, the passivation layer 120*b* and/or the protection layer 120*d* may be a polybenzoxazole (PBO) layer, a polyimide (PI) layer or other suitable polymers. In some alternative embodiments, the passivation layer 120*b* and/or the protection layer 120*d* may be made of inorganic materials, such as silicon oxide, silicon nitride, silicon oxynitride, or any suitable dielectric material. In certain embodiments, the materials of the passivation layer 120*b* and the protection layer 120*d* may be the same or different.

In some embodiments, the semiconductor die 120 described herein may be referred as a chip or an integrated circuit (IC). In certain embodiments, the semiconductor die 120 includes one or more digital chips, analog chips or mixed signal chips, such as application-specific integrated circuit ("ASIC") chips, sensor chips, wireless and radio frequency (RF) chips, memory chips, logic chips or voltage regulator chips. In certain embodiments, the semiconductor die 120 may further include additional semiconductor chip(s) of the same type or different types.

In some embodiments, an insulating encapsulant 114 is formed to laterally wrap the conductive vias 110 and the semiconductor die 120 (i.e. cover side walls of the conductive vias 110 and the semiconductor die 120, and surround the conductive vias 110 and the semiconductor die 120). In some embodiments, the insulating encapsulant 114 is formed by a molding process or an over-molding process. In some embodiments, the insulating encapsulant 114, for example, is a molding compound made of a polymeric material (such as epoxy resins, phenolic resins, silicon-containing resins, or other suitable resins). In some embodiments, the insulating encapsulant 114 may further include inorganic filler or inorganic compound (e.g. silica, clay, etc.) as additive added therein to optimize the coefficient of thermal expansion (CTE) of the insulating encapsulant 114.

In some embodiments, the insulating encapsulant 114 at least fills up the gaps between the conductive vias 110 and the gaps between the conductive vias 110 and the semiconductor die 120. The insulating encapsulant 114 also covers the topmost layer of the dielectric layers 106 not covered by the conductive vias 110 and the semiconductor die 120.

In some embodiments, the insulating encapsulant 114 may be planarized until the conductive vias 110 and the conductive pillars 120*c* of the semiconductor die 120 are exposed from the insulating encapsulant 114. In some embodiments, the planarization process may include a chemical-mechanical polish (CMP), a grinding process, or the like. In some embodiments, after the planarization, top surfaces of the conductive vias 110 and top surfaces of the conductive pillars 120*c* of the semiconductor die 120 become substantially levelled with and coplanar with the top surface of the insulating encapsulant 114. That is, for example, the top surfaces of the conductive pillars 120*c* and the protection layer 120*d* of the semiconductor die 120 and the top surfaces of the conductive vias 110 are levelled with the top surface of the insulating encapsulant 114.

Figure 5:
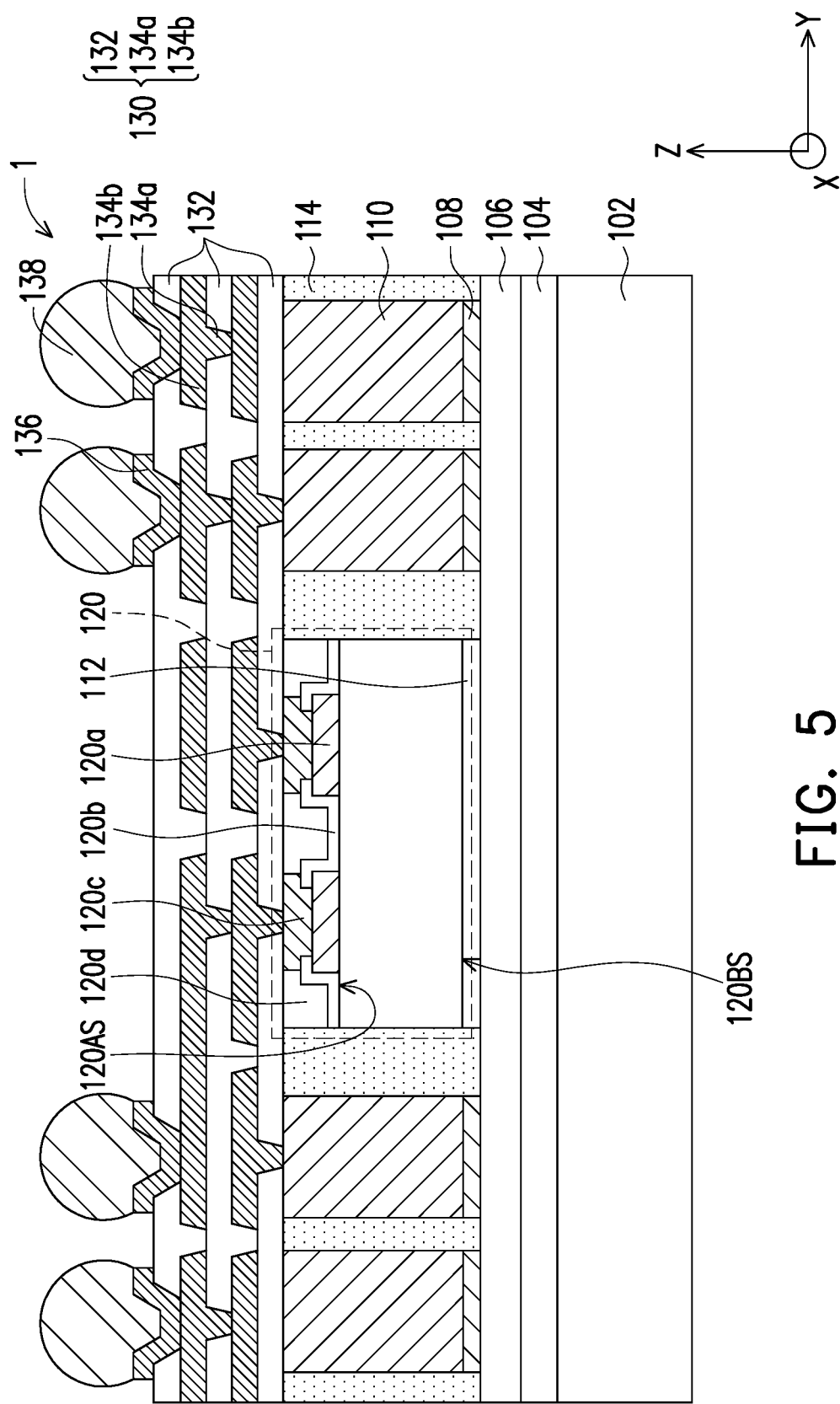

Referring to FIG. 5, in some embodiments, a redistribution layer 130 is formed on the insulating encapsulant 114. Since the redistribution layer 130 is formed on the active side of the semiconductor die 120, the redistribution layer 130 may also be referred as the front-side redistribution layer 130. In certain embodiments, the redistribution layer 130 is formed over and covers the conductive vias 110, the semiconductor die 120 and the insulating encapsulant 114. In some embodiments, the redistribution layer 130 is electrically connected with the semiconductor die 120 and the conductive vias 110, which functions as electrical connection structures. In some embodiments, the redistribution layer 130 is electrically connected to the semiconductor die 120 through the conductive pads 120*a* and the conductive pillars 120*c*.

In some embodiments, the redistribution layer 130 includes one or more dielectric layers 132 and one or more metallization layers 134 arranged in alternation. In certain embodiments, one or more the metallization layers 134 may include metal vias 134*a* and metal routings 134*b* mechanically and electrically interconnected through the metal vias 134*a*. In some embodiments, the metallization layer 134 is sandwiched between the dielectric layers 132, but the top surface of topmost layer of the metallization layers 134 is exposed by the topmost layer of the dielectric layers 132 and the bottom surface of the lowest layer of the metallization layers 134 is exposed by the lowest layer of the dielectric layers 132 to connect the conductive vias 110 and the conductive pillars 120c. The number of the dielectric layers 132 and the metallization layers 134 included in the redistribution layer 130 is determined according to the desired properties of the package structure. In some embodiments, the material of the dielectric layers 132 includes polyimide, epoxy resin, acrylic resin, phenol resin, benzocyclobutene (BCB), polybenzoxazole (PBO), or any other suitable polybased dielectric material. The dielectric layers 132 may be formed by deposition. In some embodiments, the material of the metallization layers 134 includes aluminum, titanium, copper, nickel, tungsten, and/or alloys thereof. The metallization layers 134 may be formed by electroplating or deposition. In some embodiments, the materials of the dielectric layers 132 and the dielectric layer 106 may be the same or different.

In some embodiments, under-ball metallurgy (UBM) patterns 136 may be formed on the top surface of the topmost layer of the metallization layers 134 exposed by the topmost layer of the dielectric layers 132 for electrically connecting with conductive elements (such as conductive balls) or other additional semiconductor element (e.g., passive components or active components)). In some embodiments, the materials of the UBM patterns 136 may include copper, nickel, titanium, tungsten, or alloys thereof or the like, and may be formed by an electroplating process, for example. The number of the UBM patterns 136 corresponds to the number of portions of the top surface of the topmost layer of the metallization layers 134 exposed by the topmost layer of the dielectric layers 132.

In some embodiments, conductive elements 138 are formed on the redistribution layer 130 and are electrically connected to the redistribution layer 130 through the UBM patterns 136. In some embodiments, the conductive elements 138 may be disposed on the UBM patterns 136 by ball placement process or reflow process. In some embodiments, the conductive elements 138 are, for example, solder balls or ball grid array (BGA) balls.

In some embodiments, the conductive elements 138 are electrically connected to the redistribution layer 130 through the UBM patterns 136. In some embodiments, some of the conductive elements 138 are electrically connected to the semiconductor die 120 through the UBM patterns 136, the redistribution layer 130 and the conductive pillars 120c. In some embodiments, the conductive elements 138 are electrically connected to some of the conductive vias 110 through the UBM patterns 136 and the redistribution layer 130.

Figure 6:
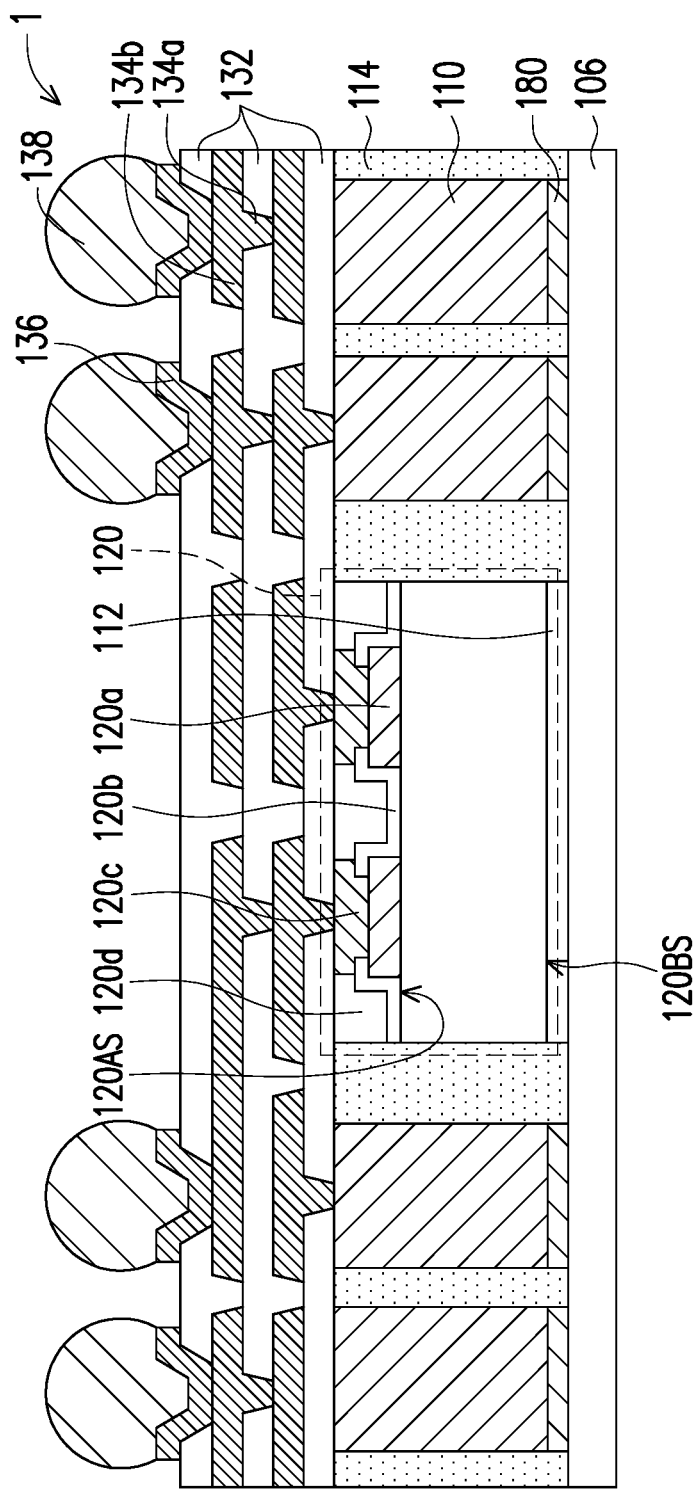

Referring to FIG. 6, in some embodiments, the carrier 102 is debonded from the dielectric layer 106. In some embodiments, the carrier 102 is easily separated from the dielectric layer 106 due to the buffer layer 104. As shown in FIG. 6, the bottom surfaces of the insulating encapsulant 114, the seed layer 108, and the semiconductor die 120 are covered by the dielectric layer 106.

In some embodiments, the debonding process is a laser debonding process. During the debonding process, a holding device may be utilized to secure the package and the package may be held by the side where the conductive elements 138 reside. In some embodiments, the holding device may be an adhesive tape, a carrier film or a suction pad (not shown).

Figure 7:
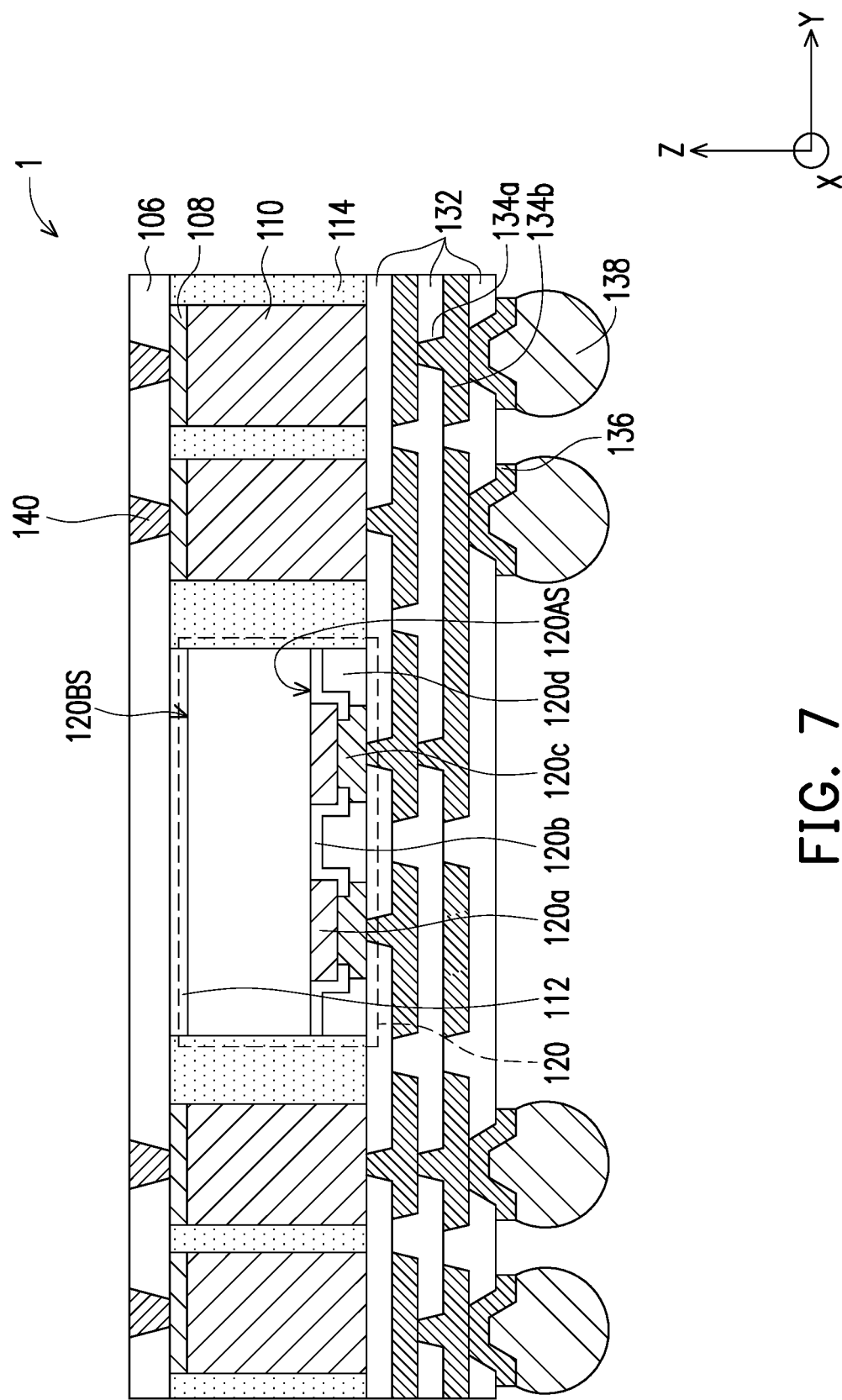

Referring to FIG. 7, the package structure 1 is flipped. The dielectric layer 106 is patterned and etched to form via openings, wherein the positions of the via openings correspond to the position of the seed layers 108 and the conductive vias 110. The metal vias 140 are formed in via openings of the dielectric layer 106. In some embodiments, the bottom surfaces of the metal vias 140 are electrically contacted to the seed layer 108 and the conductive vias 110. The top surfaces of the metal vias 140 are substantially levelled with and coplanar with the top surface of the dielectric layer 106, which is opposite to the bottom surface of the dielectric layer 106 attaching the seed layer 108, the insulating encapsulant 114 and the die attach film 112. In some embodiments, the material of the metal vias 140 includes aluminum, titanium, copper, nickel, tungsten, and/or alloys thereof. The metal vias 140 may be formed by electroplating or deposition.

Figure 8:
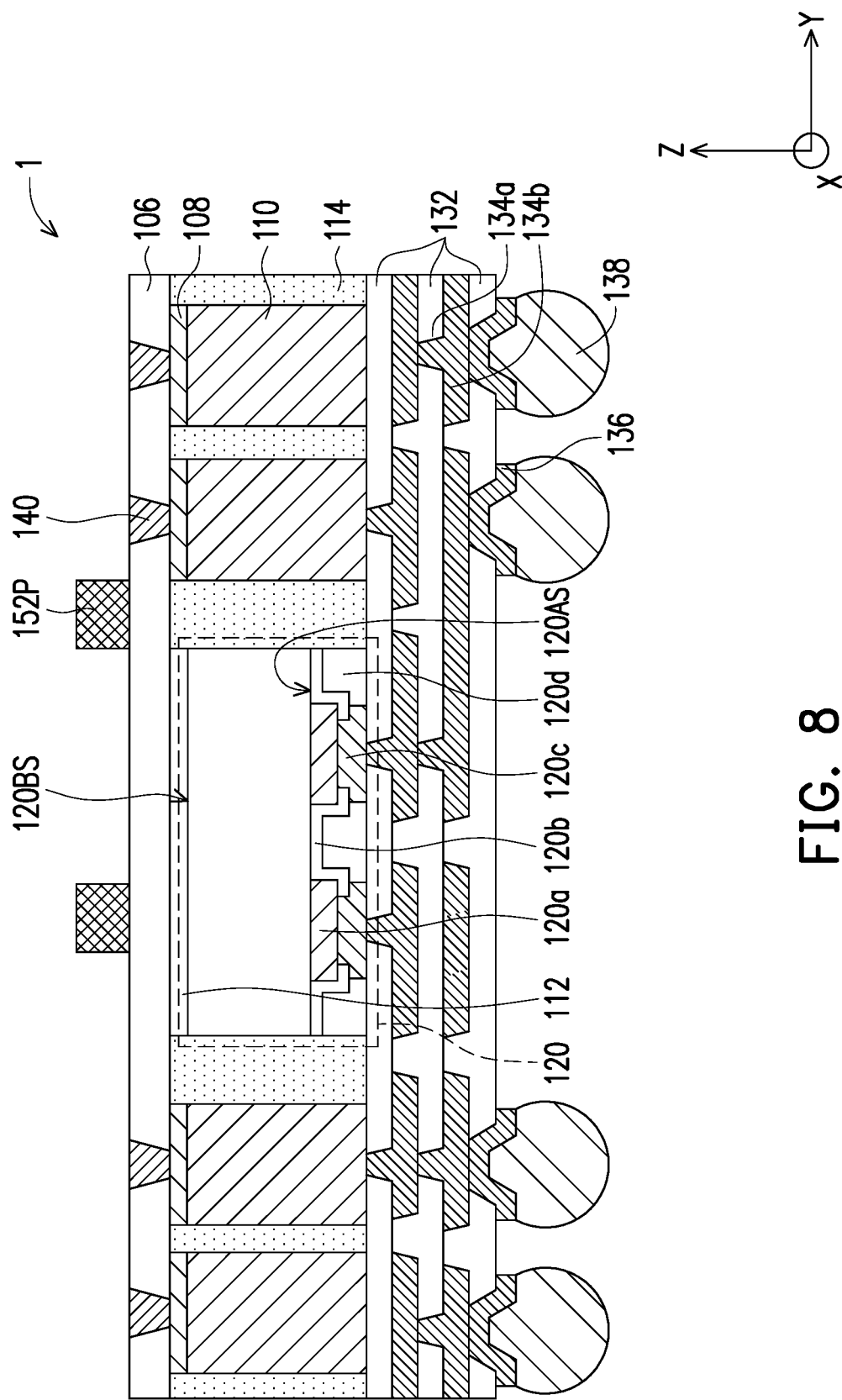

Referring to FIG. 8, a photoresist (not shown) is formed and patterned on the dielectric layer 106. The photoresist may be formed by spin coating or the like and may be exposed to light for patterning. The pattern of the photoresist corresponds to the P-type semiconductor blocks 152P to be formed on the dielectric layer 106. The pattern of the photoresist does not overlap with the positions of the metal vias 140. The patterning forms openings through the photoresist to expose the dielectric layer 106. After the photoresist is patterned, the photoresist may be referred to as a patterned mask layer.

Then, P-type semiconductors 152P are formed in the openings of the photoresist over the dielectric layer 106. The material of the P-type semiconductors 152P may be $Sb_2Te_3$ (antimony telluride), P-type polysilicon, or the like. The P-type semiconductors 152P may be formed by ALD, CVD, MOCVD, PECVD, evaporation, and/or other suitable technique.

After the P-type semiconductors 152P are formed, the photoresist may be removed by an acceptable ashing or stripping process, such as using an oxygen plasma or the like. After the photoresist are removed, the P-type semiconductors 152P forms the P-type semiconductor blocks 152P.

Figure 9:
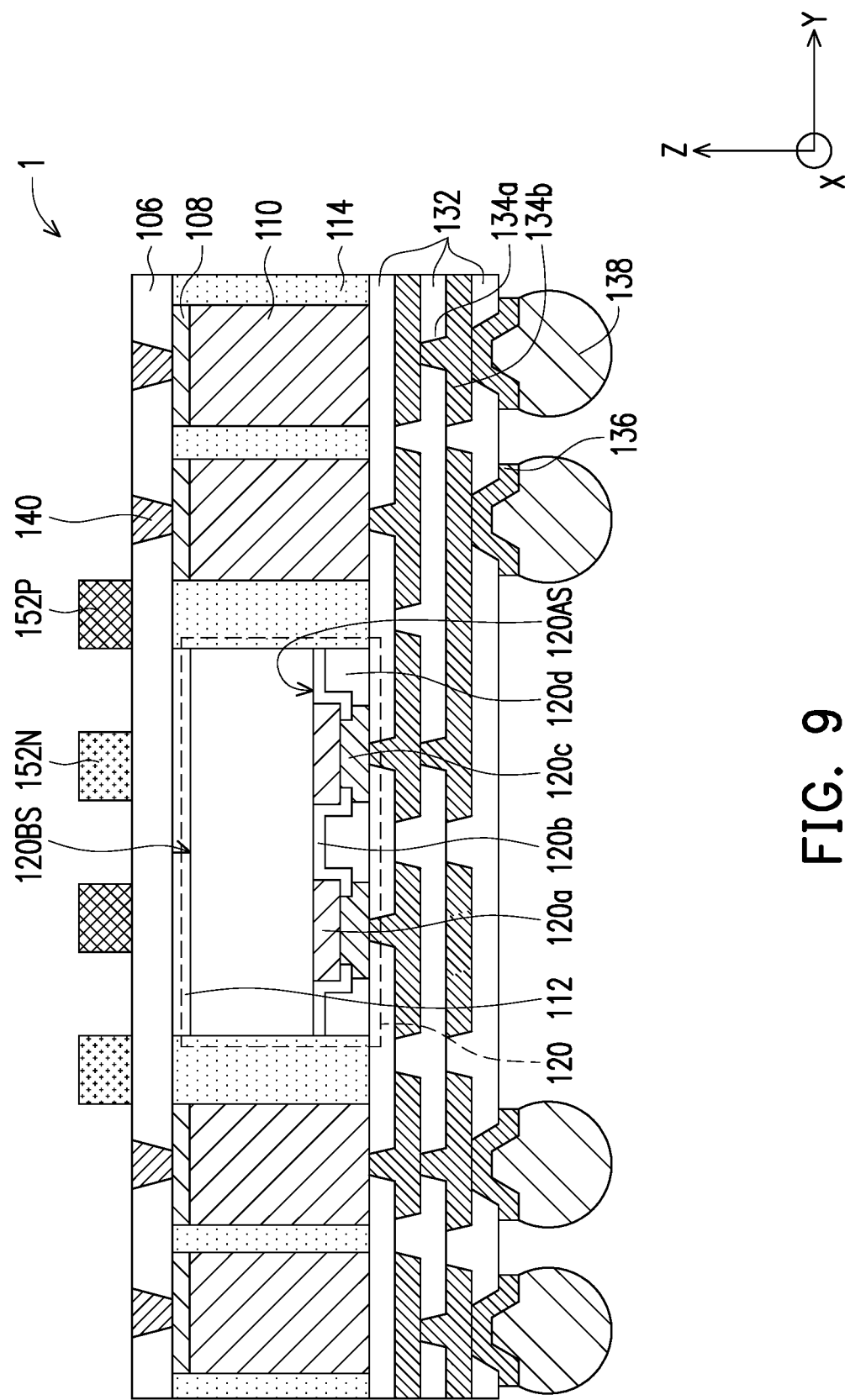

Referring to FIG. 9, the N-type semiconductor blocks 152N are formed on the dielectric layer 106. The formation methods of the N-type semiconductor blocks 152N are similar to the processes for forming the P-type semiconductor blocks as described in FIG. 8, and thus may not be repeated herein.

The material of the N-type semiconductor blocks 152N may be $Bi_2Te_3$ (bismuth telluride), N-type polysilicon, or the like. The N-type semiconductor material 152N may be formed by ALD, CVD, MOCVD, PECVD, evaporation, and/or other suitable technique.

In some embodiments, the order to deposit P-type semiconductor blocks 152P and N-type semiconductor blocks 152N may be swapped, which is that, in some embodiments, the P-type semiconductor blocks 152P may be formed before forming the N-type semiconductor blocks 152N, and in some embodiments, the N-type semiconductor blocks 152N may be formed before forming the P-type semiconductor blocks 152P.

Figure 10:
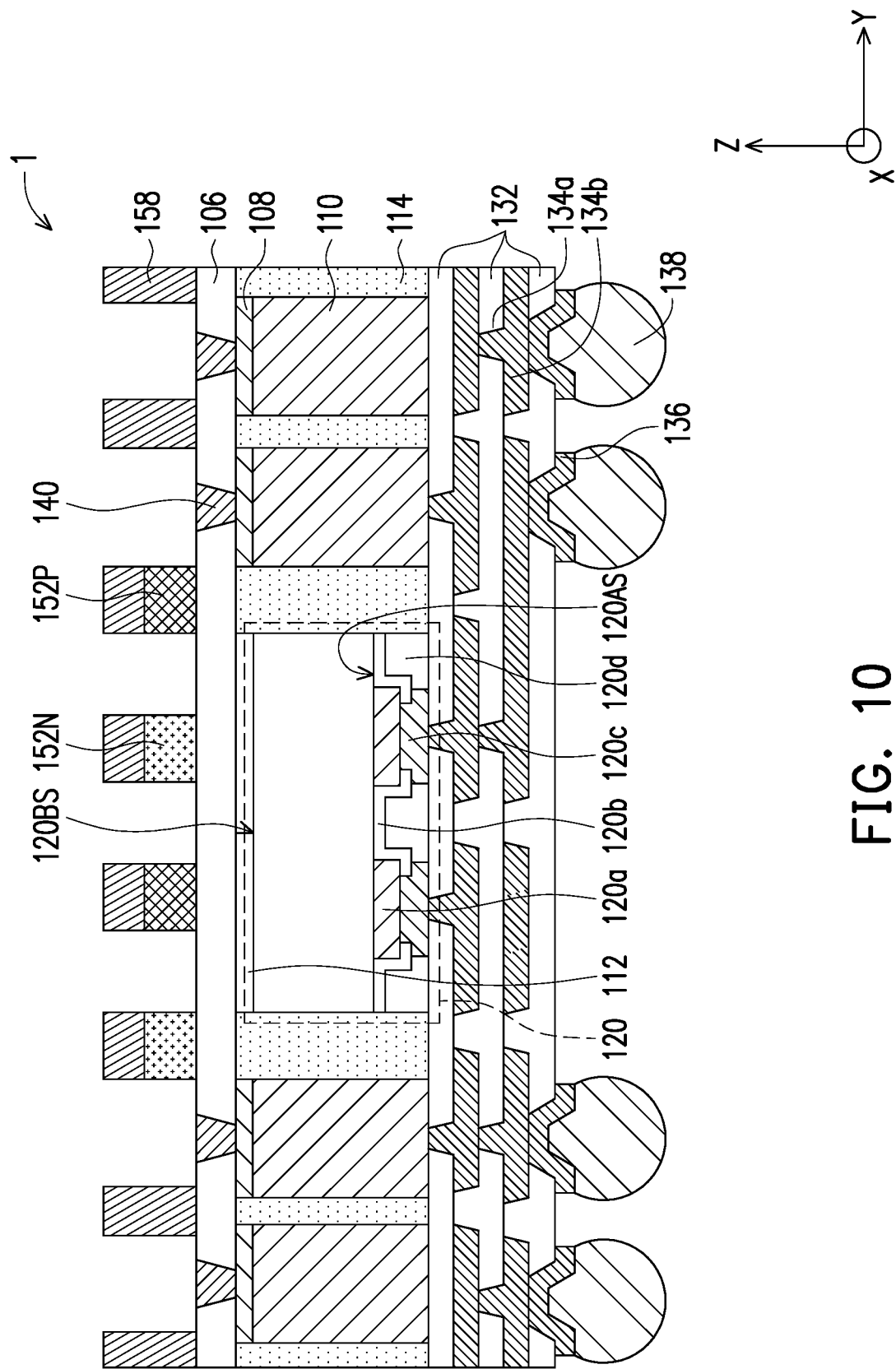

Referring to FIG. 10, a photo-sensitive dielectric pattern 158 is formed on the dielectric layer 106, the P-type semiconductor blocks 152P and the N-type semiconductor blocks 152N. In some embodiments, the dielectric pattern 158 is formed right on the P-type semiconductor blocks 152P and the N-type semiconductor blocks 152N and the dielectric pattern 158 has openings exposing the dielectric layer 106 and the metal vias 140. For example, the dielectric pattern 158 is formed by depositing a photo-sensitive dielectric material over the dielectric layer 106, covering the P-type semiconductor blocks 152P and the N-type semiconductor blocks 152N, forming a mask (not shown) and then exposing the photosensitive dielectric material through the mask to a light (e.g. a UV light), and then removing portions of the photosensitive dielectric material to form the dielectric pattern 158 In one embodiment, portions of the photosensitive dielectric materials that are covered by the mask and protected from the UV irradiation are removed. In some embodiments, the photosensitive dielectric pattern 158 is formed by deposition such as CVD or spin-coating.

Figure 11:
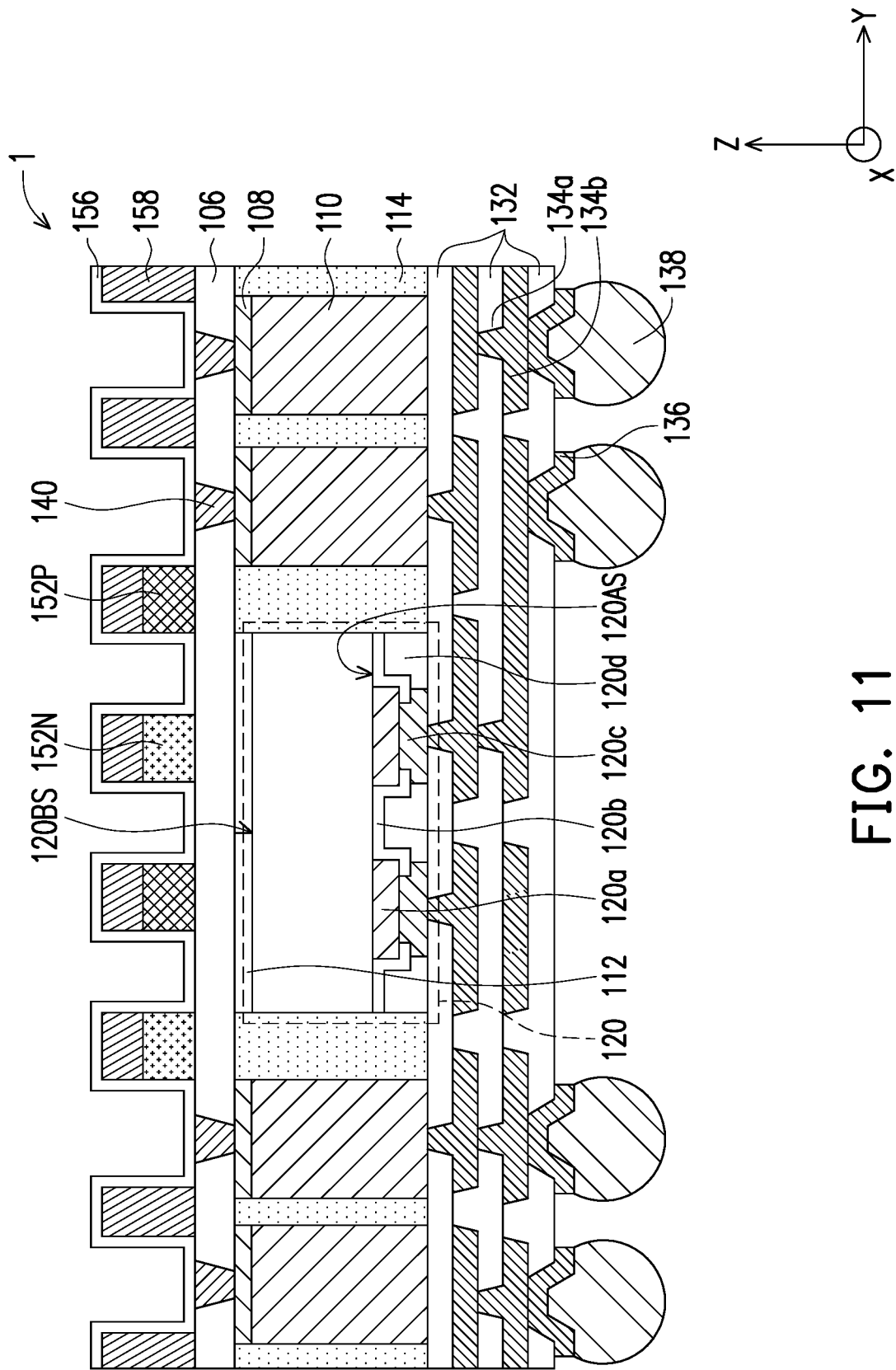

Referring to FIG. 11, a seed/barrier layer 156 is formed over the dielectric pattern 158 and the dielectric layer 106 conformally covering the dielectric pattern 158, the P-type semiconductor blocks 152P, the N-type semiconductor blocks 152N and the dielectric layer 106. In some embodiments, the seed/barrier layer 156 is formed by sputtering, ALD or CVD. In some embodiments, the seed/barrier layer 156 is formed directly on the metal vias 140. In some embodiments, the seed/barrier layer 156 includes a metallic layer, which may be a single layer or a composite layer comprising a plurality of sub-layers formed of different materials. In some embodiments, the seed/barrier layers 156 may be Ti, Ti—Cu, Ti—Ni, Ti—Cu—Ni, or the like.

Figure 12:
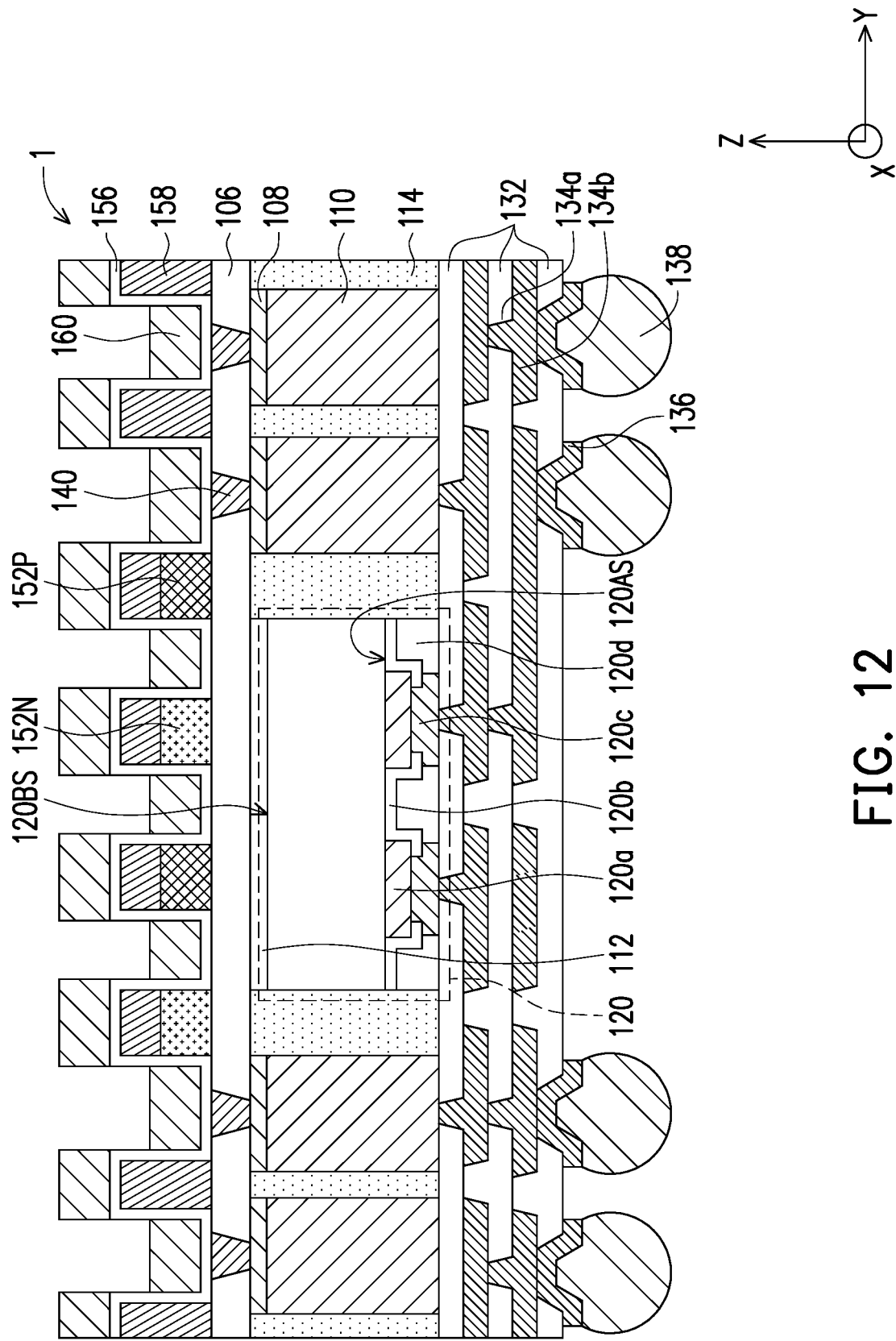

Referring to FIG. 12, a conductive material 160 is formed on the seed/barrier layer 156 filling in the openings of the patterned dielectric pattern 158. For example, the conductive material 160 may be formed by plating, such as electroplating or electroless plating, or the like. In some embodiments, the conductive material 160 may include a metal, like copper, titanium, tungsten, aluminum, or a combination thereof.

Figure 13:
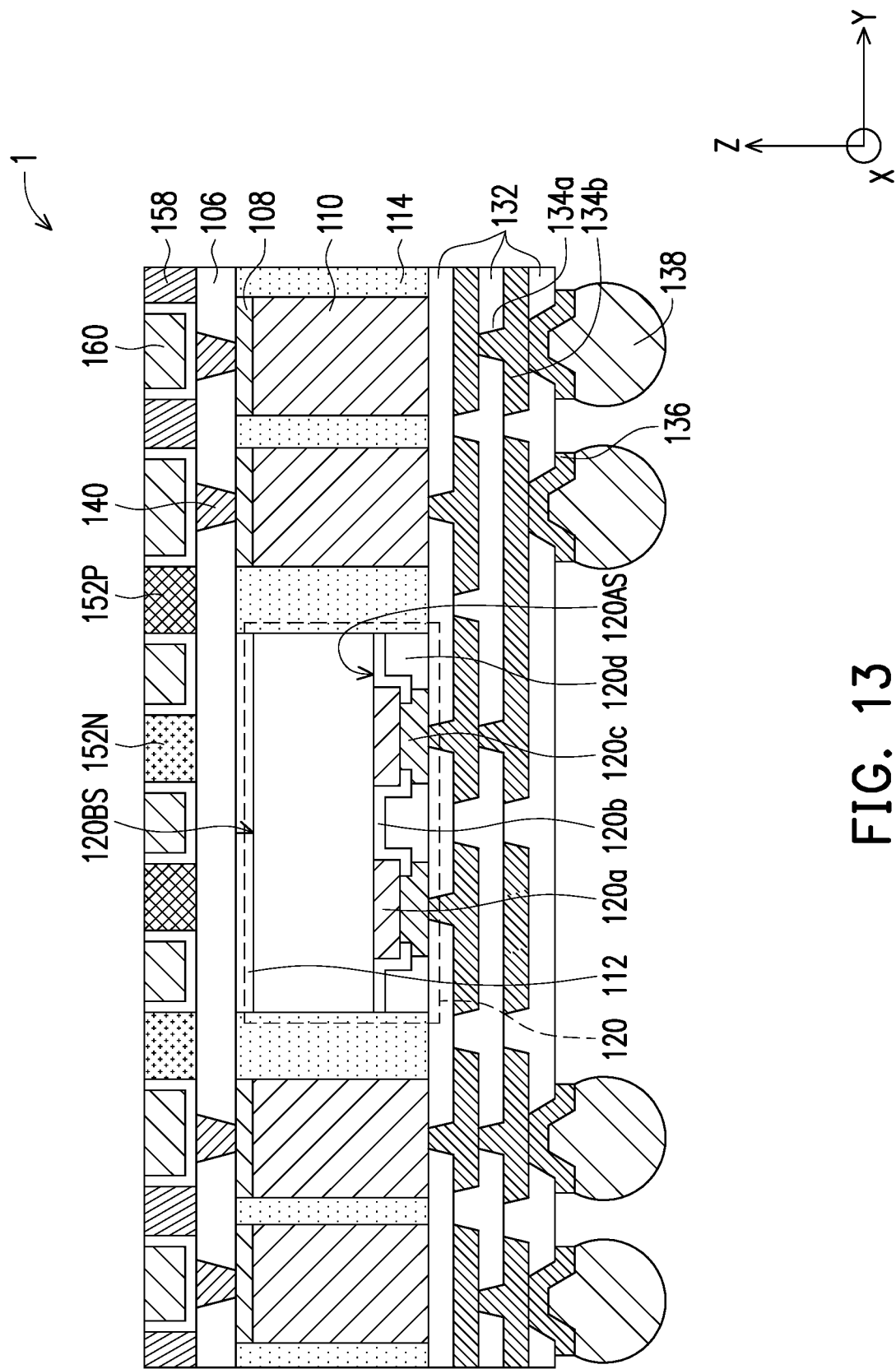

Referring to FIG. 13, after the conductive material 160 is formed, a planarization process is performed to remove the extra conductive material 160, the extra dielectric pattern 158, and the extra seed/barrier layer 156. After planarization, the top surfaces of the planarized dielectric pattern 158, the planarized conductive material 160, the planarized P-type semiconductor blocks 152P, and the planarized N-type semiconductor blocks 152N are substantially levelled with and coplanar with each other. In one embodiment, the seed/barrier layer 156 located above the planarized P-type semiconductor blocks 152P, and the planarized N-type semiconductor blocks 152N are removed by the planarization process. In some embodiments, the planarization process includes, for example, a CMP process, a grinding process, or a combination thereof. In some embodiments, during the planarization process, a portion of the top surfaces of the P-type semiconductor blocks 152P, and the N-type semiconductor blocks 152N may be removed. In some embodiments, after planarization, the thickness of the planarized P-type semiconductor blocks 152P, the planarized N-type semiconductor blocks 152N and the planarized dielectric pattern 158 ranges between 1-3 µm, preferably 2 µm. In some embodiments, the planarized conductive material 160 has a thickness ranging between 1-3 µm, preferably 2 µm.

Figure 13A:
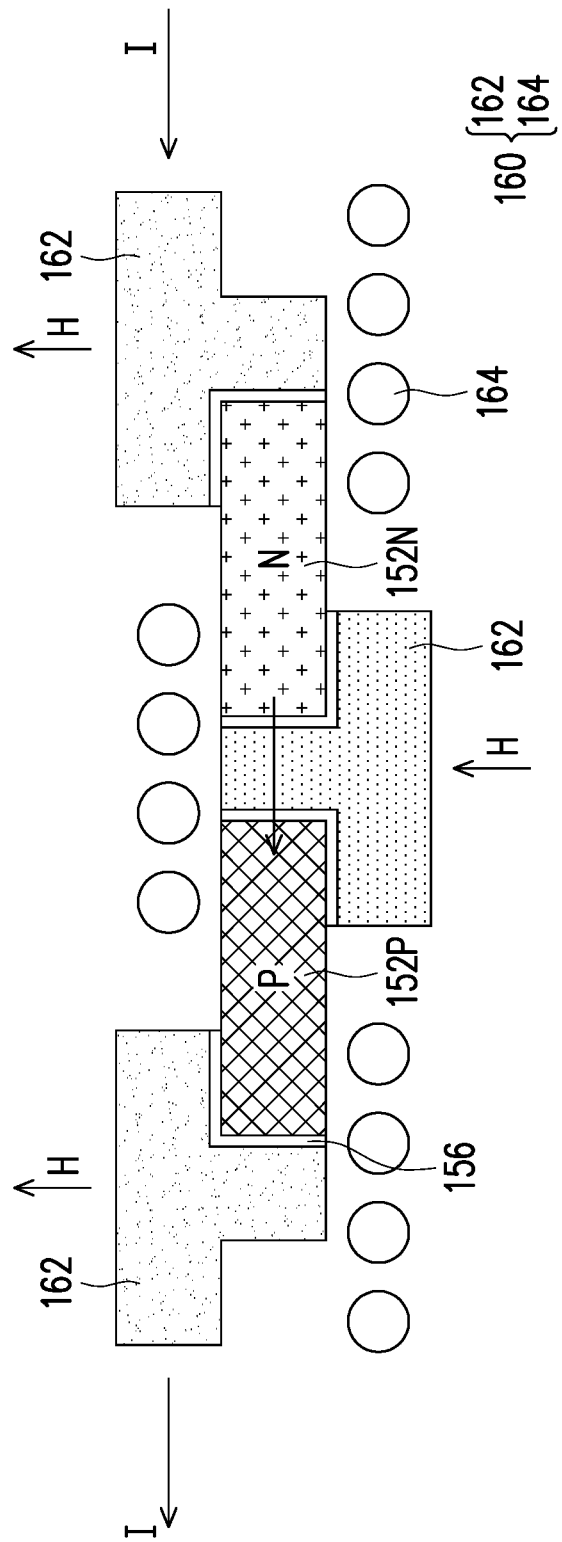
FIG. 13A is a schematic top view illustrating relative positions between a thermoelectric device and metal vias according to some exemplary embodiments of the present disclosure.

FIG. 13A is a schematic top view illustrating relative positions of the thermoelectric device and metal vias, and shows only a portion of the thermoelectric device located on the back-side of the semiconductor die. Referring to FIG. 13 and FIG. 13A, the planarized conductive material 160 is formed to include metal pad 162 and metal vias 164. From FIG. 13A, the P-type semiconductor block 152P and the N-type semiconductor block 152N are connected through the T-shaped metal pads 162 located therebetween. The seed/barrier layer 156 is located between the metal pads 162 and the P-type semiconductor blocks 152P and between the metal pads 162 and the N-type semiconductor blocks 152N.

In FIG. 13A, the current I flows through the metal pad 162 at the right, the N-type semiconductor block 152N, the middle metal pad 162, the P-type semiconductor block 152P, and then the metal pad 162 at the left.

In some embodiments, the metal vias 164 may be formed in the space between the two metal pads 162 facing the same direction, as shown in FIG. 13A. The number of metal vias 164 formed between the two metal pads is not limited by the embodiments or drawings herein. Due to the arrangement of the metal pads 162, the spaces between the two metal pads 162 may be as large as twice the length $L_S$ of the P-type semiconductor blocks 152P or the N-type semiconductor blocks 152N. In some embodiments, the length of the spaces between the two metal pads 162 is 1600 µm, which provides a larger space for metal vias 164.

In some embodiments, the metal pads 162 may be electrically connected to the front-side redistribution layer 130 through the metal vias 140 and the conductive vias 110, so the current may be feed to the thermoelectric device through the front-side redistribution layer 130. In some embodiments, the metal pads 162 may be further connected to the subsequently formed back-side redistribution layer. In some embodiment, the metal vias 164 may be connected to the front-side redistribution layer 130 through the metal vias 140 and the conductive vias 110, so the electrical signal may be transmitted to the front-side redistribution layer 130.

Figure 14:
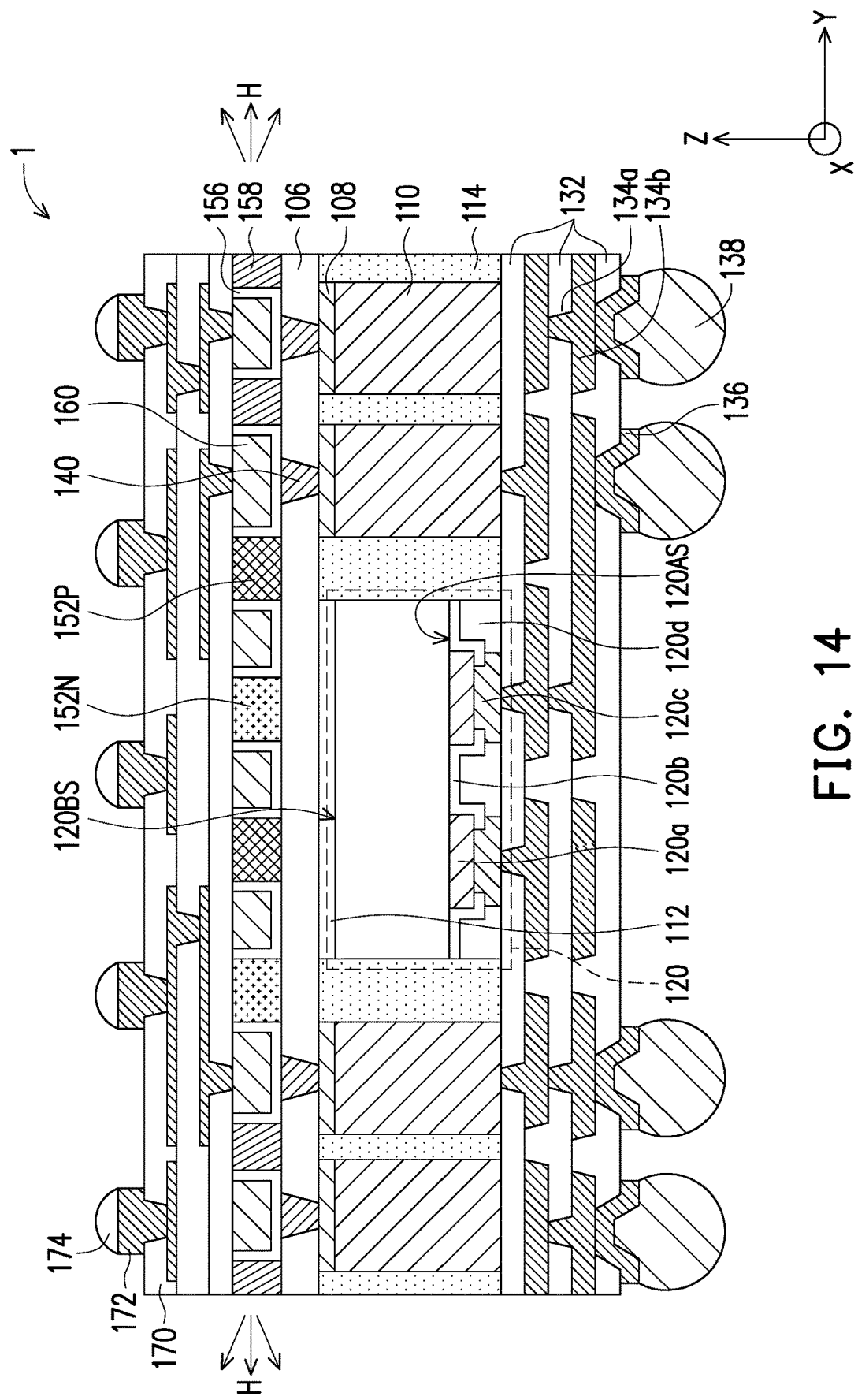

Referring to FIG. 14, a back-side redistribution layer 170 is formed over the dielectric layer 158. The back-side redistribution layer 170 electrically connects with the conductive material 160, which includes the metal pads 162 and the metal vias 164. The formation methods and materials of the redistribution layer 170 are similar to the methods and materials for forming the redistribution layer 130 as described in FIG. 5, and shall not be repeated herein. In some embodiments, the current flows to the P-type semiconductor blocks 152P and the N-type semiconductor blocks 152N through the redistribution layer 170 and the conductive material 160.

In some embodiments, the dielectric layer 106, the metal vias 140, the P-type semiconductor blocks 152P, the N-type semiconductor blocks 152N, the conductive material 160 and the dielectric layer 158 may also be referred as a portion of the back-side redistribution layer 170.

In some embodiments, the under-ball metallurgy (UBM) patterns 172 may be formed on the top surface of the back-side redistribution layer 170 and electrically connected with the back-side redistribution layer 170. A plurality of conductive elements 174 is formed on the back-side redistribution layer 170 and are electrically connected to the back-side redistribution layer 170 through the UBM patterns 172. The formation methods and materials of the UBM patterns 172 and the conductive elements 174 are similar to the methods and materials for forming UBM patterns 136 and conductive elements 138 as described in FIG. 6, and shall not be repeated herein.

In some embodiments, the conductive elements 174 electrically connects to the N-type semiconductor blocks 152N and the P-type semiconductor blocks 152P through the UBM patterns 172, the back-side redistribution layer 170, and the metal pads 162, As a result, the electric current may be sent from the conductive elements 174 to the N-type semiconductor blocks 152N and the P-type semiconductor blocks 152P, so that the N-type semiconductor blocks 152N and the P-type semiconductor blocks 152P may function as a thermoelectric structure to actively remove the heat generated by the semiconductor die 120, so the heat may be released outside of the package structure 1 through the side walls of the package structure 1.

In some embodiments, the conductive elements 174 electrically connects to the semiconductor die 120 through the UBM patterns 172, the back-side redistribution layer 170, the metal vias 164, the conductive vias 110, the front-side redistribution layer 130, the conductive pillars 120c, and the pads 120a. As a result, the electric signals may be sent to/from the semiconductor die 120 through the conductive elements 174.

In some embodiments, the conductive elements 174 electrically connects to the conductive elements 138 through the UBM patterns 172, the back-side redistribution layer 170, the metal vias 164, the conductive vias 110, the front-side redistribution layer 130, and the UBM patterns 136. As a result, the electric signals may be sent to/from the conductive elements 138 through the conductive elements 174.

The package structure comprises a semiconductor die 120 and thermoelectric structures disposed at the back-side of the semiconductor die 120. The thermoelectric structure includes thermoelectric devices comprising P-type semiconductor blocks 152P and N-type semiconductor blocks 152N, which is part of the back-side redistribution layer 170. When the current flows through the N-type semiconductor blocks 152N to the P-type semiconductor blocks 152P, the heat generated by the semiconductor die 120 may be transferred away from the semiconductor die 120 to cool the semiconductor die 120. In some embodiments, the current flow into the P-type semiconductor blocks 152P and N-type semiconductor blocks 152N may flow from the front-side redistribution layer 130 and leave from the front side redistribution layer 130, or flow from the back-side redistribution layer 170 and leave from the back-side redistribution layer 170, or flow from the front-side redistribution layer 130 and leave from the back-side redistribution layer 170 or vice versa. By transferring the heat generated from the semiconductor die 120 to the side walls of the package structure 1, the temperature of the semiconductor die 120 may be lowered, and the performance of the semiconductor die 120 may be increased.

Figure 15:
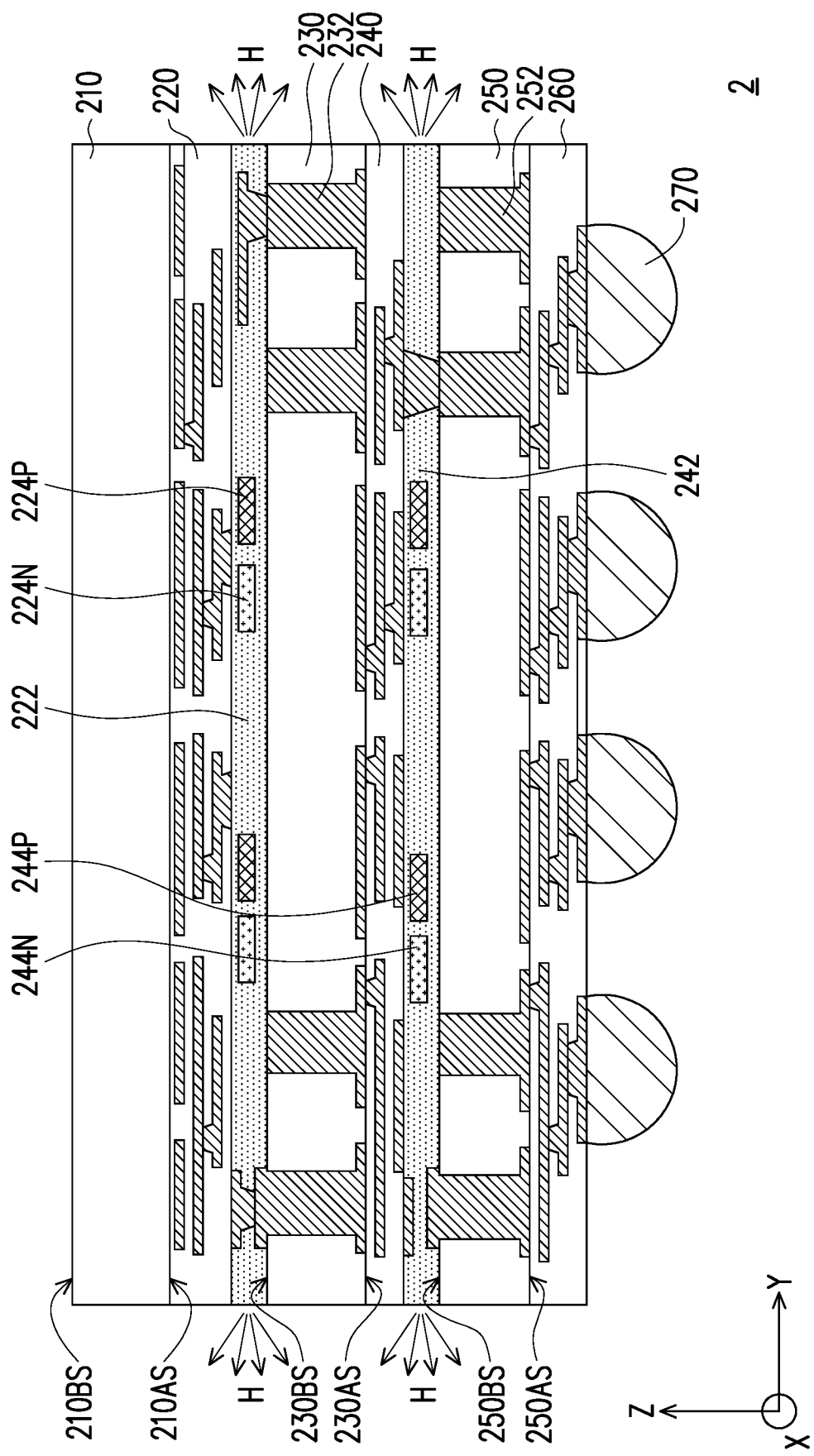
FIG. 15 is a schematic cross-sectional view of a three-dimensional integrated circuit (3DIC) package according to some exemplary embodiments of the present disclosure.

Referring to FIG. 15, three semiconductor dies 210, 230, and 250 are vertically stacked and electrically connected to each other in the 3DIC package 2. In some embodiments, each of the semiconductor dies 210, 230 and 250 includes a chip or an integrated circuit. In some embodiments, the semiconductor dies 210, 230 and 250 may be the same type of die, or may be different types of dies. In some embodiments, the number of the semiconductor dies in the 3DIC package may be less than three or more than three, which depends on the required performance of the 3DIC package. In some embodiments, the stacked dies 250, 230 and 210 are interconnected through through-silicon-vias (TSV) 252, 232 and interconnection layer located there-between. In some embodiments, the thermoelectric structure layers 222 and 242 may be sandwiched between the interconnection layers 220, 240 and sandwiched between the vertically stacked semiconductor dies 250, 230 and 210 so as to transfer the heat generated by the semiconductor dies 250, 230 and 210 out of the 3DIC package 2.

In FIG. 15, the semiconductor dies 210, 230 and 250 are vertically stacked in a face-to-back way. As shown in FIG. 15, the active surface 210AS of the semiconductor die 210 faces the back-side surface 230BS of the semiconductor die 230, and the active surface 230AS of the semiconductor die 230 faces the back-side surface 250BS of the semiconductor die 250. As shown in FIG. 15, the interconnection layers 220, 240 and 260 are formed on the active surfaces 210AS, 230AS and 250 AS of the semiconductor dies 210, 230 and 250, and the interconnection layers 220, 240 and 260, which include dielectric layers and metallization structures, electrically connect the semiconductor dies 210, 230 and 250. In some embodiments, the 3DIC package 2 may be further connected to other devices or component through conductive elements 270 formed on the interconnection layer 260.

As shown in FIG. 15, the 3DIC package 2 includes thermoelectric structure layers 222 and 242. In some embodiments, the thermoelectric structure layer 222 include a plurality of thermoelectric devices, wherein each of the thermoelectric device includes a P-type semiconductor block 224P and a N-type semiconductor block 224N. In some embodiments, the thermoelectric structure layer 242 includes a plurality of thermoelectric devices, wherein each of the thermoelectric device includes a P-type semiconductor block 244P and a N-type semiconductor block 244N. The thermoelectric structure layers 222 and 242 are respectively in contact with the back-side surface 230BS of semiconductor die 230 and the back-side surface 250BS. The thermoelectric structure layers 222 and 242 are electrically connected with the semiconductor dies 230 and 250 through the through-silicon-vias (TSV) 232 and 252. The thermoelectric structure layer 222 and 242 also electrically connected with the interconnection layers 220 and 240 respectively.

In some embodiments, the schematic top views of the thermoelectric devices formed in the thermoelectric structure layer 222 and 242 may be similar to the thermoelectric structures 150A1, 150A2 or 150A3 as shown in FIG. 3A to FIG. 3C. However, other arrangements of the thermoelectric devices are possible depending on the product design and desired performance.

With the thermoelectric structure layer 222 or 242 formed on the back-side surface 230BS or 250BS of the semiconductor die 230 or 250, when the semiconductor die 230 or 250 operates, the heat H generated by the semiconductor die 230 or 250 is transferred by the thermoelectric structure layer 222 and the heat H is further transferred away and out of the 3DIC package 2 (heat dissipation direction shown as arrows). As a result, the thermoelectric structure layer 222 and/or 242 can help to dissipate the heat generated by the semiconductor die 230 or 250, which improves the performance of the 3DIC package 2.

Figure 16:
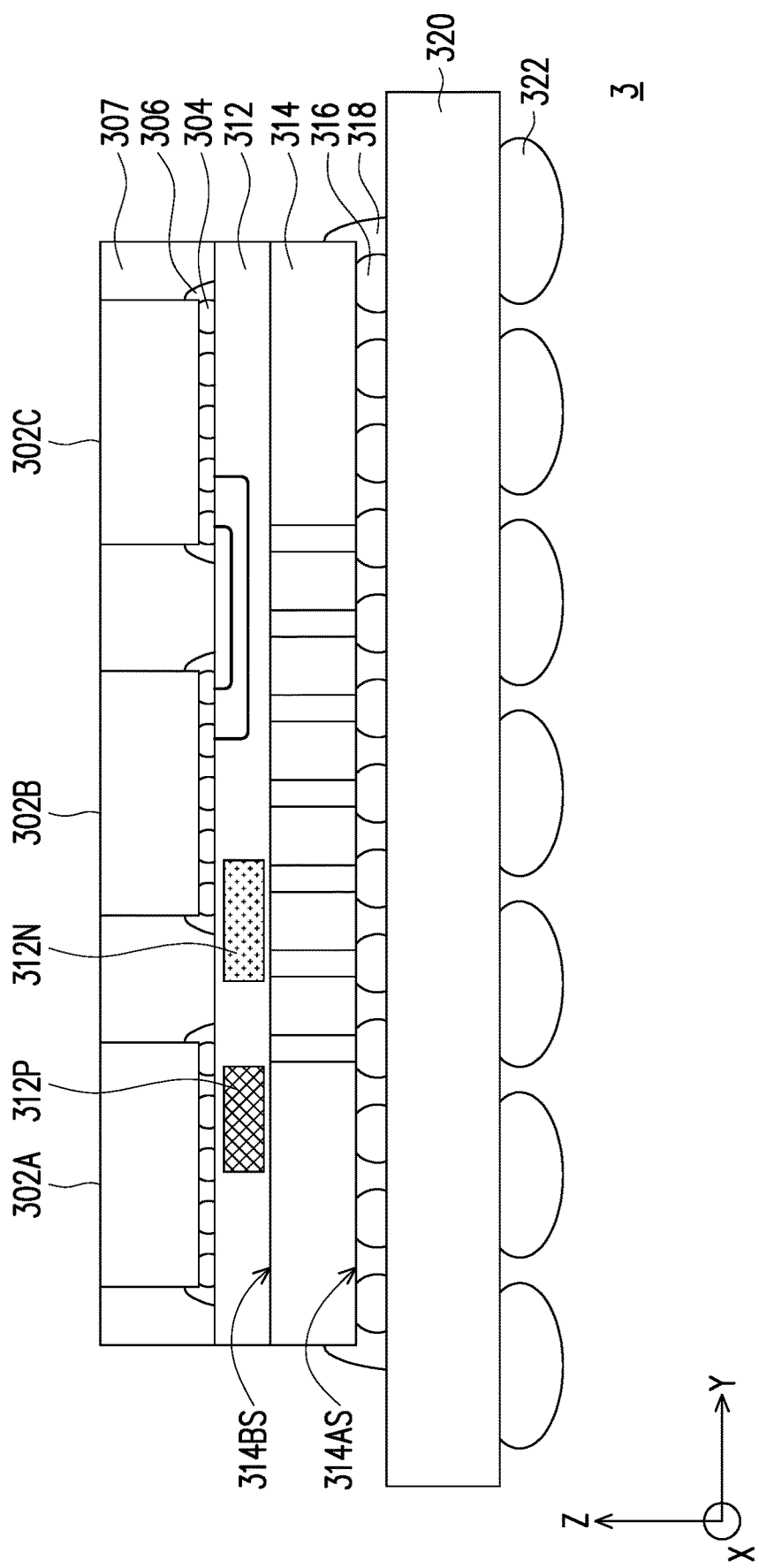
FIG. 16 is a schematic cross-sectional view of a chip-on-wafer-on-substrate (CoWoS) package according to some exemplary embodiments of the present disclosure.

Referring to FIG. 16, in the chip-on-wafer-on-substrate (CoWoS) package 3, a thermoelectric structure layer 312 is formed on an interposer 314. As shown in FIG. 16, semiconductor dies 302A, 302B, 302C are bonded and electrically connected with the interposer 314. In some embodiments, the semiconductor dies 302A, 302B and 302C are bonded to the thermoelectric structure layer 312 through connectors 304 and are electrically connected to the interposer 314 though the wirings formed in the thermoelectric structure layer 312. In some embodiments, the semiconductor dies 302A and 303C may include hybrid memory dies, and the semiconductor die 303B includes a system-on-chip. In some embodiments, the semiconductor dies 302A, 302B and 302C are secured to the thermoelectric structure layer 312 through an underfill material 306 therebetween and are further molded with the interposer 314 by an encapsulant 307.

In some embodiments, the thermoelectric structure layer 312 include a plurality of thermoelectric devices, wherein each of the thermoelectric device includes a P-type semiconductor block 312P and a N-type semiconductor block 312N. In some embodiments, the schematic top views of the thermoelectric devices in the thermoelectric structure layer 312 may be similar to the thermoelectric structures 150A1, 150A2 or 150A3 as shown in FIG. 3A to FIG. 3C.

In some embodiments, the interposer 314 includes active devices such as transistors (not shown) embedded therein. In addition, passive devices (not shown) such as resistors and/or capacitors may also be included in the interposer 314. In some embodiments, the interposer 314 is bonded to a circuit substrate 320. The interposer 314 may be electrically and mechanically coupled to the circuit substrate 320 through connectors 316 and an underfill material 318 may be formed between the interposer 314 and the circuit substrate 320 and surrounding the connectors 316. In some embodiments, the circuit substrate 320 may be a package substrate, such as a laminated circuit board or a printed circuit board (PCB), and connectors 322 are formed on the bottom surface of the circuit substrate 320 for further electrical connection.

In some embodiments, when the active devices in the interposer 314 is operating, heat is generated and the thermoelectric devices in the thermoelectric structure layer 312 disposed on the back-side surface 314BS of the interposer 314 function to dissipate the heat out of the CoWoS package 3. Hence, the overall performance of the CoWoS package 3 is improved.

The thermoelectric structure described above provides an interlayer cooling, which can efficiently cool the semiconductor device, and also reduce the overall package size by reducing the height of the whole package. The horizontally stacked thermoelectric structures also provide higher heat dissipating ability than the heat sink type cooling. Also, with the arrangement of the P-type and N-type semiconductor blocks, and the metal pads connecting the P-type and N-type semiconductor blocks, there are more spaces for conductive vias for vertical connections with the front-side or back-side redistribution layers, which might be more friendly for layout design. The manufacturing of thermoelectric devices may be easily integrated into the manufacturing process of the back-side reintubation process or the hybrid bond process.

According to some embodiments, a package structure is provided. The package structure includes a semiconductor die, and a thermoelectric structure disposed on the semiconductor die. The thermoelectric structure comprises P-type semiconductor blocks, N-type semiconductor blocks and metal pads. The P-type semiconductor blocks and the N-type semiconductor blocks are arranged in alternation with the metal pads connecting the P-type semiconductor blocks and the N-type semiconductor blocks. When a current flowing through one of the N-type semiconductor block, one of the metal pad, and one of the P-type semiconductor block in order, the metal pad between the N-type semiconductor block and the P-type semiconductor block forms a cold junction which absorbs heat generated by the semiconductor die. When the current flowing through one of the P-type semiconductor block, one of the metal pad, and one of the N-type semiconductor block in order, the metal pad between the P-type semiconductor block and the N-type semiconductor block forms a hot junction which releases the heat absorbed by the cold junction to environment.

According to some embodiments, a package structure is provided. The package structure includes a semiconductor die, conductive vias, a thermoelectric structure, and a redistribution layer. The semiconductor die is laterally wrapped by an encapsulant. The conductive vias are laterally disposed by the semiconductor die and wrapped by the encapsulant. The thermoelectric structure is disposed on a back-side of the semiconductor die and comprising P-type semiconductor blocks, N-type semiconductor blocks, and metal pads. The metal pads are disposed on a same level of the P-type semiconductor blocks and the N-type semiconductor blocks to connect the P-type semiconductor blocks and the N-type semiconductor blocks. The redistribution layer is disposed on the thermoelectric structure. The thermoelectric structure is configured to transfer heat generated by the semiconductor die to side walls of the package structure when current flows through the thermoelectric structure.

According to some embodiments, a method of forming a package structure is provided. The method includes the following steps. A semiconductor die is provided with a dielectric layer disposed over the semiconductor die. First semiconductor blocks are formed over the dielectric layer. Second semiconductor blocks are formed over the dielectric layer, wherein a material of the second semiconductor blocks is different from a material of the first semiconductor blocks. Metal pads are deposited over the dielectric layer, wherein the metal pads electrically connect with the first semiconductor blocks and the second semiconductor blocks.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package structure, comprising:
a semiconductor die; and
a thermoelectric structure disposed on the semiconductor die,
wherein the thermoelectric structure comprises P-type semiconductor blocks, N-type semiconductor blocks and metal pads,
wherein the P-type semiconductor blocks and the N-type semiconductor blocks are arranged in alternation with the metal pads connecting the P-type semiconductor blocks and the N-type semiconductor blocks,
wherein when a current flowing through one of the N-type semiconductor block, one of the metal pad, and one of the P-type semiconductor block in order, the metal pad between the N-type semiconductor block and the P-type semiconductor block forms a cold junction which absorbs heat generated by the semiconductor die,
wherein when the current flowing through one of the P-type semiconductor block, one of the metal pad, and one of the N-type semiconductor block in order, the metal pad between the P-type semiconductor block and the N-type semiconductor block forms a hot junction which releases the heat absorbed by the cold junction to environment,
wherein each of the metal pads connects with two side walls of one of the P-type semiconductor blocks and connects with two side walls of one of the N-type semiconductor blocks, and the P-type semiconductor blocks and the N-type semiconductor blocks are connected through the metal pads.

2. The package structure of claim 1, wherein the thermoelectric structure is disposed on a back-side of the semiconductor die.

3. The package structure of claim 1, wherein the P-type semiconductor blocks and the N-type semiconductor blocks are rectangular-shaped from a top view, and long sides of the rectangular-shaped P-type semiconductor blocks and the rectangular-shaped N-type semiconductor blocks are substantially parallel with a flowing direction of the current flowing through the thermoelectric structure.

4. The package structure of claim 1, wherein each of the metal pads is a T-shaped metal pad having a stem portion and an arm portion connected with the stem portion.

5. The package structure of claim 4, wherein the stem portion of the T-shaped metal pad contacts with a side wall at a short side of the P-type semiconductor block and a side wall at a short side of the N-type semiconductor block, and the arm portion of the T-shaped metal pad contacts with a portion of a side wall at the long side of the P-type semiconductor block, a portion of a side wall at the long side of the N-type semiconductor block, and the first portion of the T-shaped metal pad.

6. The package structure of claim 4, wherein when the metal pad is the cold junction, the arm portion of the T-shaped metal pad faces an interior of the package structure, and when the metal pad is the hot junction, the arm portion of the T-shaped metal pad faces an exterior of the package structure.

7. The package structure of claim 1, wherein barrier layers are formed between the P-type semiconductor block and the metal pad, and between the N-type semiconductor block and the metal pad.

8. A package structure, comprising:
a semiconductor die laterally wrapped by an encapsulant;
conductive vias, laterally disposed by the semiconductor die and wrapped by the encapsulant;
a thermoelectric structure, disposed on a back-side of the semiconductor die and comprising P-type semiconductor blocks, N-type semiconductor blocks, and metal pads, wherein the metal pads are disposed on a same level of the P-type semiconductor blocks and the N-type semiconductor blocks to connect the P-type semiconductor blocks and the N-type semiconductor blocks; and
a redistribution layer, disposed on the thermoelectric structure,
wherein the thermoelectric structure is configured to transfer heat generated by the semiconductor die to side walls of the package structure when a current flows through the thermoelectric structure,
wherein the metal pads are T-shaped, wherein arm portions of the adjacent T-shaped metal pads are at opposite sides of the P-type semiconductor blocks and the N-type semiconductor blocks from the top view.

9. The package structure of claim 8, wherein the conductive vias are electrically connected with the thermoelectric structure, and the current flows to the thermoelectric structure through the conductive vias.

10. The package structure of claim 8, wherein the P-type semiconductor blocks and the N-type semiconductor blocks are arranged in alternation with the metal pads sandwiched between the P-type semiconductor blocks and the N-type semiconductor blocks, the metal pads include first metal pads and second metal pads, for each pair of one P-type semiconductor block and one N-type semiconductor block, one first metal pad is filled between the one P-type semiconductor block and the one N-type semiconductor block, and one second metal pad is filled between one pair and the next pair.

11. The package structure of claim 8, further comprises metal vias disposed between the arm portions of the metal pads on the same side of the P-type semiconductor blocks and the N-type semiconductor blocks, wherein the metal vias are electrically separated from the P-type semiconductor blocks and the N-type semiconductor blocks, and are electrically connected with the redistribution layer.

12. The package structure of claim 8, wherein the current flows from a first semiconductor block to a second semiconductor block through the metal pad in the thermoelectric structure,
wherein when the first semiconductor block is the N-type semiconductor block and the second semiconductor block is the P-type semiconductor block, the metal pad is a cold junction with the arm portion of the metal pad facing an interior of the package structure and absorbing the heat generated by the semiconductor die,
wherein when the first semiconductor block is the P-type semiconductor block and the second semiconductor block is the N-type semiconductor block, the metal pad is a hot junction with the arm portion of the metal pad facing an exterior of the package structure and releasing the heat absorbed from the arm portion of the cold junction to environment.

13. The package structure of claim 8, wherein the P-type semiconductor blocks and the N-type semiconductor blocks are rectangular-shaped from a top view, wherein long sides of the P-type semiconductor block and the N-type semiconductor block are substantially parallel with a flowing direction of the current, wherein the long sides of the P-type semiconductor blocks and the N-type semiconductor blocks are between 200-800 μm and short sides of the P-type semiconductor blocks and the N-type semiconductor blocks are between 100-200 μm.

14. The package structure of claim 4, wherein the arm portion of the T-shaped metal pad of the cold junction and the arm portion of the T-shaped metal pad of the hot junction are located on opposite sides of the thermoelectric structure.

15. The package structure of claim 1, wherein the P-type semiconductor blocks, the N-type semiconductor blocks and the metal pads are disposed on a same level.

* * * * *